US 12,424,260 B2

(12) United States Patent
Bueb et al.

(10) Patent No.: US 12,424,260 B2
(45) Date of Patent: Sep. 23, 2025

(54) TRIGGERING A REFRESH FOR NON-VOLATILE MEMORY

(71) Applicant: Micron Technology, Inc., Boise, ID (US)

(72) Inventors: Christopher Joseph Bueb, Folsom, CA (US); Minjian Wu, Shanghai (CN)

(73) Assignee: Micron Technology, Inc., Boise, ID (US)

( * ) Notice: Subject to any disclaimer, the term of this patent is extended or adjusted under 35 U.S.C. 154(b) by 382 days.

(21) Appl. No.: 17/868,074

(22) Filed: Jul. 19, 2022

(65) Prior Publication Data

US 2023/0039381 A1 Feb. 9, 2023

Related U.S. Application Data

(60) Provisional application No. 63/229,328, filed on Aug. 4, 2021.

(51) Int. Cl.
G11C 16/34 (2006.01)
G11C 5/14 (2006.01)
G11C 11/406 (2006.01)
G11C 16/04 (2006.01)
G11C 7/04 (2006.01)

(52) U.S. Cl.
CPC ........ *G11C 11/40615* (2013.01); *G11C 5/148* (2013.01); *G11C 16/0483* (2013.01); *G11C 16/3418* (2013.01); *G11C 7/04* (2013.01)

(58) Field of Classification Search
CPC .............. G11C 11/40615; G11C 5/148; G11C 16/0483; G11C 16/3418; G11C 7/04
See application file for complete search history.

(56) References Cited

U.S. PATENT DOCUMENTS

| | | | |
|---|---|---|---|
| 2007/0195631 A1* | 8/2007 | Hoffmann | G11C 7/1045 365/230.03 |
| 2014/0254298 A1* | 9/2014 | Dally | G11C 11/40626 365/222 |
| 2015/0364190 A1* | 12/2015 | Aue | G11C 16/3431 365/222 |
| 2020/0110660 A1* | 4/2020 | Cariello | G06F 11/1048 |
| 2021/0191627 A1* | 6/2021 | Johnson | G06F 3/0634 |
| 2021/0318942 A1* | 10/2021 | Kale | B60R 16/03 |
| 2021/0325949 A1* | 10/2021 | Kale | G06F 3/0679 |
| 2022/0118879 A1* | 4/2022 | Wang | B60L 3/0046 |
| 2022/0326862 A1* | 10/2022 | Chen | G06F 3/0659 |

* cited by examiner

*Primary Examiner* — Mushfique Siddique
(74) *Attorney, Agent, or Firm* — Holland & Hart LLP

(57) ABSTRACT

Methods, systems, and devices for triggering a refresh for non-volatile memory are described. A host system may communicate with a memory system, where the host system and memory system may be included within a vehicle (e.g., an automotive system). The host system may receive an indication that the vehicle is powering down and may enter a power off state in response to the indication. The host system may detect a trigger (e.g., using a time or temperature input) to switch back to a power on state while the vehicle is powered down, the trigger associated with performing a refresh operation at the memory system. The host system may enter the power on state and may transmit a power on command to the memory system. The memory system may perform the refresh operation on one or more memory cells while the vehicle remains in the powered down state.

15 Claims, 8 Drawing Sheets

TRIGGERING A REFRESH FOR NON-VOLATILE MEMORY

CROSS REFERENCE

The present Application for Patent claims priority to U.S. Provisional Patent Application No. 63/229,328 by Bueb et al., entitled "TRIGGERING A REFRESH FOR NON-VOLATILE MEMORY" and filed Aug. 4, 2021, which is assigned to the assignee hereof and is expressly incorporated by reference in its entirety herein.

FIELD OF TECHNOLOGY

The following relates generally to one or more systems for memory and more specifically to triggering a refresh for non-volatile memory.

BACKGROUND

Memory devices are widely used to store information in various electronic devices such as computers, user devices, cameras, digital displays, and the like. Information is stored by programing memory cells within a memory device to various states. For example, binary memory cells may be programmed to one of two supported states, often corresponding to a logic 1 or a logic 0. In some examples, a single memory cell may support more than two possible states, any one of which may be stored by the memory cell. To access information stored by a memory device, a component may read, or sense, the state of one or more memory cells within the memory device. To store information, a component may write, or program, one or more memory cells within the memory device to corresponding states.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), 3-dimensional cross-point memory (3D cross point), not-or (NOR) and not- and (NAND) memory devices, and others. Memory devices may be volatile or non-volatile. Volatile memory cells (e.g., DRAM cells) may lose their programmed states over time unless they are periodically refreshed by an external power source. Non-volatile memory cells (e.g., NAND memory cells) may maintain their programmed states for extended periods of time even in the absence of an external power source.

A host system may communicate with a memory system including a memory device configured to operate in a range of ambient temperatures. In some cases, operating the memory device at various temperatures may result in varying operating characteristics of the memory device. For example, automotive systems (e.g., vehicles, vehicle components, vehicle processors or controllers) may operate at a variety of temperatures, which may include temperatures (e.g., extreme temperatures) relatively higher than a nominal temperature of a memory device, the nominal temperature supporting one or more performance characteristics for the memory device. In some cases, one or more non-volatile blocks of the memory device may be programmed at extreme temperatures, for example, while an automotive system is powered on (e.g., due to ambient heat from an engine, a battery, or any other heat source in the environment of the memory device). However, programming blocks of the memory device at extreme temperatures may result in relatively unreliable data storage. In some cases, the memory system may not be able to accurately read the blocks due to a difference in operating characteristics at a programming temperature and a read temperature, for example, a read temperature after the automotive system has been powered off for an extended period of time, allowing the automotive system to cool down. Additionally or alternatively, due to such read failures, the memory device may fail to retain data programmed at extreme temperatures for relatively long periods of time. For example, the automotive system may turn on after a relatively long period of time and the memory system may fail to refresh non-volatile blocks of the memory device, potentially result in a loss of data. In some cases, memory devices including memory cells configured to store more than one bit per memory cell (e.g., multi-level cell (MLC) devices, tri-level cell (TLC) devices, quad-level cell (QLC) devices, or any other memory capable of storing more than one bit per memory cell) may be less reliable than memory devices including single-level cells (SLCs) if programmed at extreme temperatures, for example, due to smaller differences in voltage thresholds bounding the different states of the memory cells storing more than one bit per cell.

DETAILED DESCRIPTION

Systems, devices, and techniques are described to support triggering a refresh for non-volatile memory in a memory device after an automotive system powers down. Refreshing the non-volatile memory after the automotive system powers down may mitigate the negative effects of programming the non-volatile memory at extreme temperatures (e.g., temperatures above a threshold temperature for the memory device). For example, in response to an automotive system powering down, a host system may enter a power off state. In some cases, in the power off state, the host system controller may monitor one or more inputs (e.g., environmental inputs such as temperature, time, or both) to determine whether to trigger a refresh operation at a memory system, for example, while the automotive system remains powered down. The host system may detect a trigger to refresh the memory system based on (e.g., in response to) determining that one or more inputs satisfy respective trigger conditions. For example, a trigger may cause a host system controller of the host system to reenter a power on state and send one or more refresh commands to the memory system while the automotive system is powered down (e.g., in a parked mode), providing the memory system a means of refreshing a memory device-including memory cells programmed at extreme temperatures—as the automotive system temperature relaxes towards a nominal temperature. As such, the memory system may perform a refresh operation in response to a refresh command from the host system controller. For example, the host system controller may transmit a command to power on the memory system and may transmit a refresh command for the memory system to perform a refresh operation on one or more memory cells of the memory system if a temperature value satisfies a temperature threshold for refreshing the memory system, a threshold time has passed for refreshing the memory system, or both. Configuring a host system to detect a refresh trigger supporting non-volatile memory refresh operations may result in higher data retention at the memory system and improved reliability of access operations, among other enhancements to cross temperature behavior of the host system, the memory system, or both.

Figure 1:
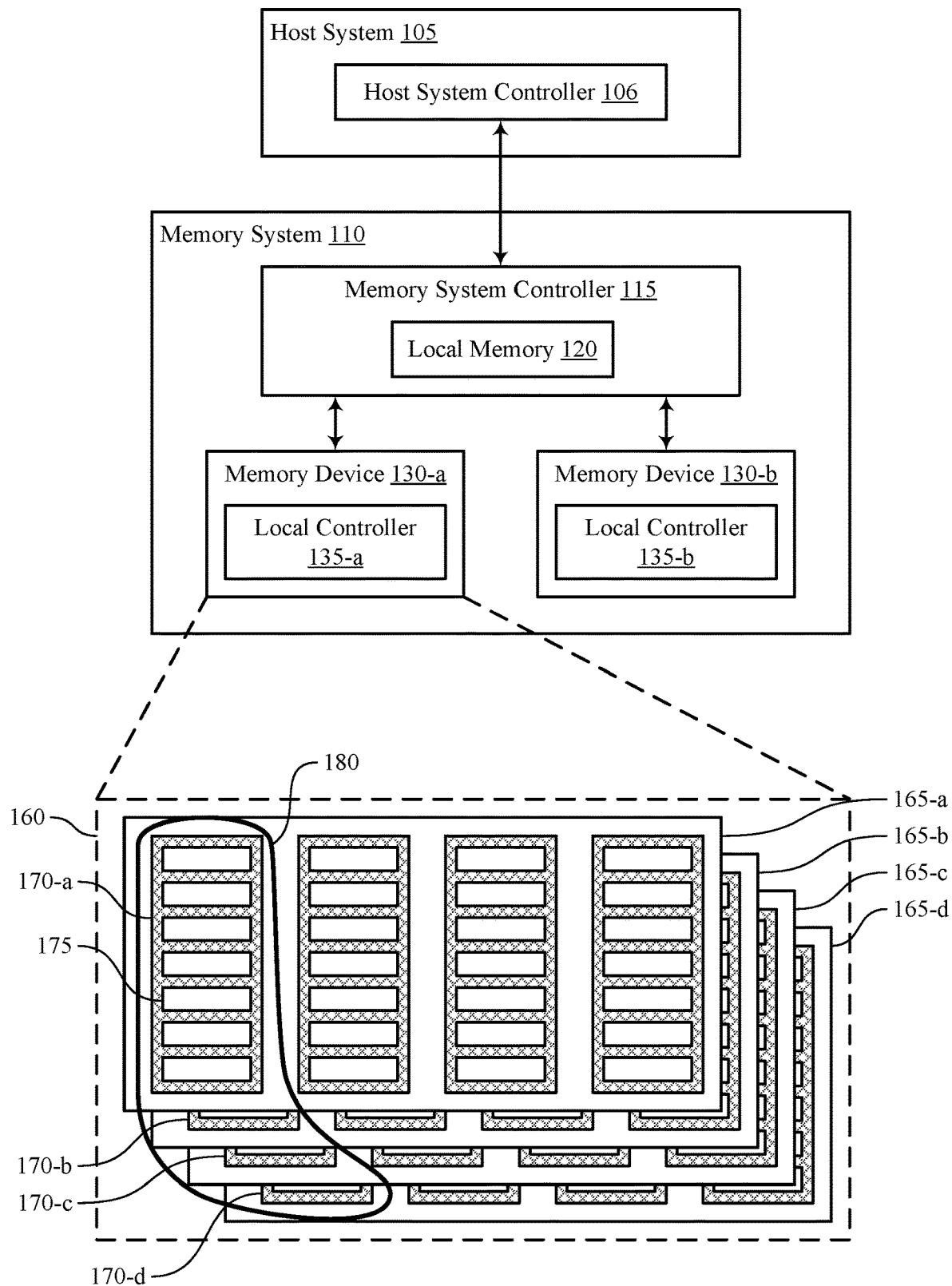
FIGS. 1 through 3 illustrate examples of systems that support triggering a refresh for non-volatile memory in accordance with examples as disclosed herein.
Figure 2:
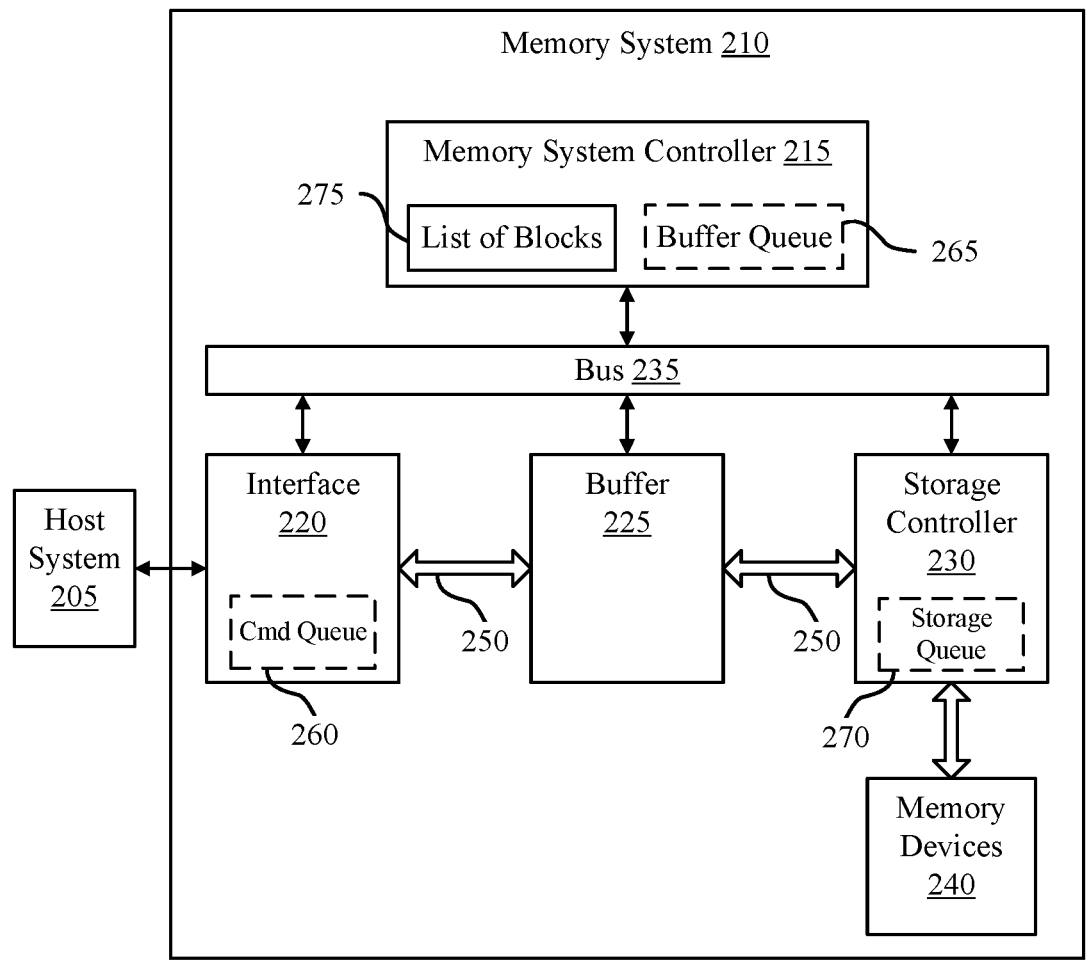
Figure 3:
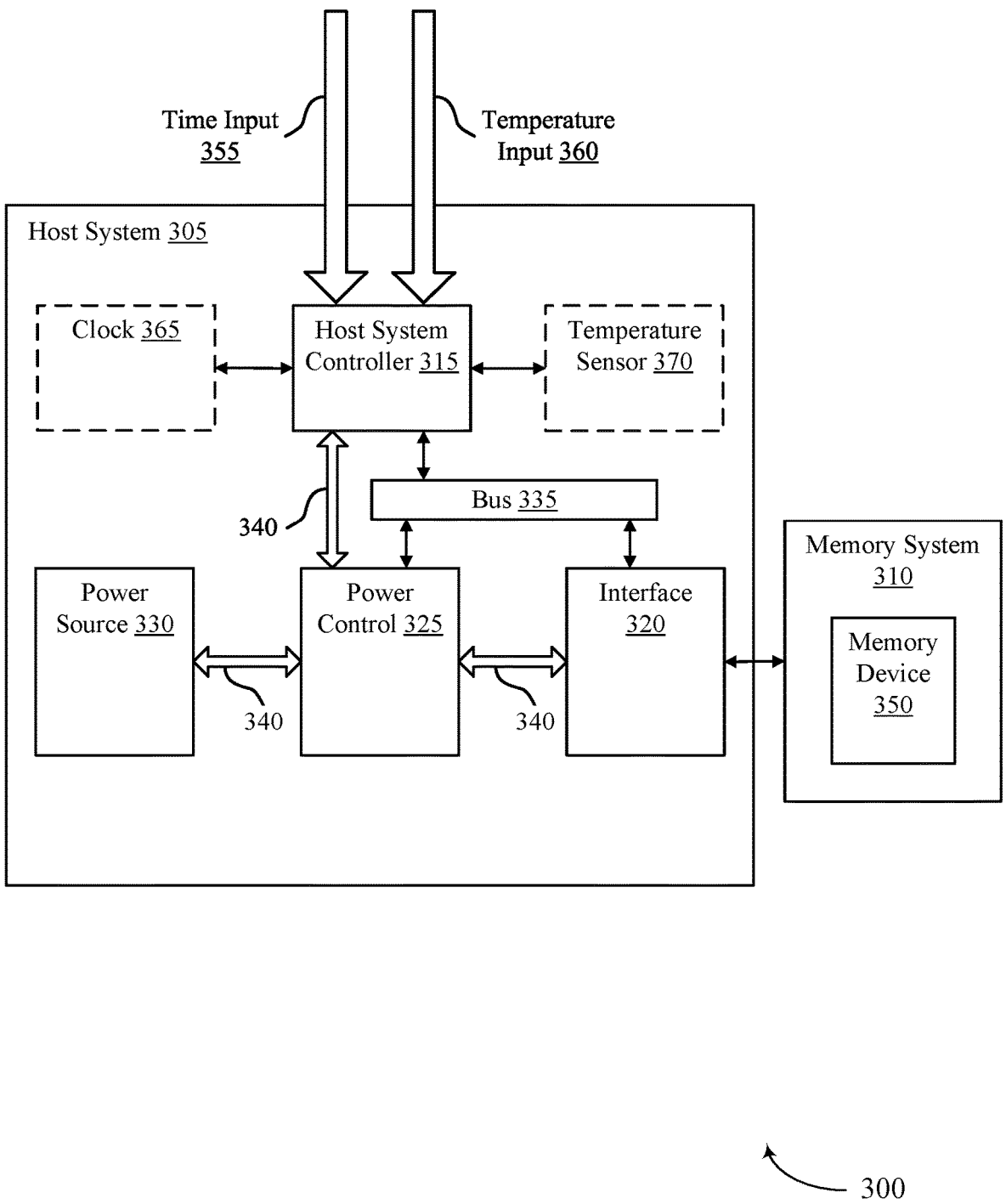

Features of the disclosure are initially described in the context of systems and devices with reference to FIGS. 1 through 3. Features of the disclosure are further described in the context of a process flow with reference to FIG. 4. These and other features of the disclosure are further illustrated by and described in the context of apparatus diagrams and flowcharts that relate to triggering a refresh for non-volatile memory with reference to FIGS. 5 through 8.

FIG. 1 illustrates an example of a system 100 that supports triggering a refresh for non-volatile memory in accordance with examples as disclosed herein. The system 100 includes a host system 105 coupled with a memory system 110.

A memory system 110 may be or include any device or collection of devices, where the device or collection of devices includes at least one memory array. For example, a memory system 110 may be or include a Universal Flash Storage (UFS) device, an embedded Multi-Media Controller (eMMC) device, a flash device, a universal serial bus (USB) flash device, a secure digital (SD) card, a solid-state drive (SSD), a hard disk drive (HDD), a dual in-line memory module (DIMM), a small outline DIMM (SO-DIMM), or a non-volatile DIMM (NVDIMM), among other possibilities.

The system 100 may be included in a computing device such as a desktop computer, a laptop computer, a network server, a mobile device, a vehicle (e.g., airplane, drone, train, automobile, or other conveyance), an Internet of Things (IoT) enabled device, an embedded computer (e.g., one included in a vehicle, industrial equipment, or a networked commercial device), or any other computing device that includes memory and a processing device.

The system 100 may include a host system 105, which may be coupled with the memory system 110. In some examples, this coupling may include an interface with a host system controller 106, which may be an example of a controller or control component configured to cause the host system 105 to perform various operations in accordance with examples as described herein. The host system 105 may include one or more devices, and in some cases may include a processor chipset and a software stack executed by the processor chipset. For example, the host system 105 may include an application configured for communicating with the memory system 110 or a device therein. The processor chipset may include one or more cores, one or more caches (e.g., memory local to or included in the host system 105), a memory controller (e.g., NVDIMM controller), and a storage protocol controller (e.g., peripheral component interconnect express (PCIe) controller, serial advanced technology attachment (SATA) controller). The host system 105 may use the memory system 110, for example, to write data to the memory system 110 and read data from the memory system 110. Although one memory system 110 is shown in FIG. 1, the host system 105 may be coupled with any quantity of memory systems 110.

The host system 105 may be coupled with the memory system 110 via at least one physical host interface. The host system 105 and the memory system 110 may in some cases be configured to communicate via a physical host interface using an associated protocol (e.g., to exchange or otherwise communicate control, address, data, and other signals between the memory system 110 and the host system 105). Examples of a physical host interface may include, but are not limited to, a SATA interface, a UFS interface, an eMMC interface, a PCIe interface, a USB interface, a Fiber Channel interface, a Small Computer System Interface (SCSI), a Serial Attached SCSI (SAS), a Double Data Rate (DDR) interface, a DIMM interface (e.g., DIMM socket interface that supports DDR), an Open NAND Flash Interface (ONFI), and a Low Power Double Data Rate (LPDDR) interface. In some examples, one or more such interfaces may be included in or otherwise supported between a host system controller 106 of the host system 105 and a memory system controller 115 of the memory system 110. In some examples, the host system 105 may be coupled with the memory system 110 (e.g., the host system controller 106 may be coupled with the memory system controller 115) via a respective physical host interface for each memory device 130 included in the memory system 110, or via a respective physical host interface for each type of memory device 130 included in the memory system 110.

The memory system 110 may include a memory system controller 115 and one or more memory devices 130. A memory device 130 may include one or more memory arrays of any type of memory cells (e.g., non-volatile memory cells, volatile memory cells, or any combination thereof). Although two memory devices 130-*a* and 130-*b* are shown in the example of FIG. 1, the memory system 110 may include any quantity of memory devices 130. Further, if the memory system 110 includes more than one memory device 130, different memory devices 130 within the memory system 110 may include the same or different types of memory cells.

The memory system controller 115 may be coupled with and communicate with the host system 105 (e.g., via the physical host interface) and may be an example of a controller or control component configured to cause the memory system 110 to perform various operations in accordance with examples as described herein. The memory system controller 115 may also be coupled with and communicate with memory devices 130 to perform operations such as reading data, writing data, erasing data, or refreshing data at a memory device 130-among other such operations-which may generically be referred to as access operations. In some cases, the memory system controller 115 may receive commands from the host system 105 and communicate with one or more memory devices 130 to execute such commands (e.g., at memory arrays within the one or more memory devices 130). For example, the memory system controller 115 may receive commands or operations from the host system 105 and may convert the commands or operations into instructions or appropriate commands to achieve the desired access of the memory devices 130. In some cases, the memory system controller 115 may exchange data with the host system 105 and with one or more memory devices 130 (e.g., in response to or otherwise in association with commands from the host system 105). For example, the memory system controller 115 may convert responses (e.g., data packets or other signals) associated with the memory devices 130 into corresponding signals for the host system 105.

The memory system controller 115 may be configured for other operations associated with the memory devices 130. For example, the memory system controller 115 may execute or manage operations such as wear-leveling operations, garbage collection operations, error control operations such as error-detecting operations or error-correcting operations, encryption operations, caching operations, media management operations, background refresh, health monitoring, and address translations between logical addresses (e.g., logical block addresses (LBAs)) associated with commands from the host system 105 and physical addresses (e.g., physical block addresses) associated with memory cells within the memory devices 130.

The memory system controller 115 may include hardware such as one or more integrated circuits or discrete components, a buffer memory, or a combination thereof. The hardware may include circuitry with dedicated (e.g., hardcoded) logic to perform the operations ascribed herein to the memory system controller 115. The memory system controller 115 may be or include a microcontroller, special purpose logic circuitry (e.g., a field programmable gate array (FPGA), an application specific integrated circuit (ASIC), a digital signal processor (DSP)), or any other suitable processor or processing circuitry.

The memory system controller 115 may also include a local memory 120. In some cases, the local memory 120 may include read-only memory (ROM) or other memory that may store operating code (e.g., executable instructions) executable by the memory system controller 115 to perform functions ascribed herein to the memory system controller 115. In some cases, the local memory 120 may additionally or alternatively include static random access memory (SRAM) or other memory that may be used by the memory system controller 115 for internal storage or calculations, for example, related to the functions ascribed herein to the memory system controller 115. Additionally or alternatively, the local memory 120 may serve as a cache for the memory system controller 115. For example, data may be stored in the local memory 120 if read from or written to a memory device 130, and the data may be available within the local memory 120 for subsequent retrieval for or manipulation (e.g., updating) by the host system 105 (e.g., with reduced latency relative to a memory device 130) in accordance with a cache policy.

Although the example of the memory system 110 in FIG. 1 has been illustrated as including the memory system controller 115, in some cases, a memory system 110 may not include a memory system controller 115. For example, the memory system 110 may additionally or alternatively rely upon an external controller (e.g., implemented by the host system 105) or one or more local controllers 135, which may be internal to memory devices 130, respectively, to perform the functions ascribed herein to the memory system controller 115. In general, one or more functions ascribed herein to the memory system controller 115 may in some cases instead be performed by the host system 105, a local controller 135, or any combination thereof. In some cases, a memory device 130 that is managed at least in part by a memory system controller 115 may be referred to as a managed memory device. An example of a managed memory device is a managed NAND (MNAND) device.

A memory device 130 may include one or more arrays of non-volatile memory cells. For example, a memory device 130 may include NAND (e.g., NAND flash) memory, ROM, phase change memory (PCM), self-selecting memory, other chalcogenide-based memories, ferroelectric random access memory (RAM) (FeRAM), magneto RAM (MRAM), NOR (e.g., NOR flash) memory, Spin Transfer Torque (STT)-MRAM, conductive bridging RAM (CBRAM), resistive random access memory (RRAM), oxide-based RRAM (OxRAM), electrically erasable programmable ROM (EEPROM), or any combination thereof. Additionally or alternatively, a memory device 130 may include one or more arrays of volatile memory cells. For example, a memory device 130 may include RAM memory cells, such as dynamic RAM (DRAM) memory cells and synchronous DRAM (SDRAM) memory cells.

In some examples, a memory device 130 may include (e.g., on a same die or within a same package) a local controller 135, which may execute operations on one or more memory cells of the respective memory device 130. A local controller 135 may operate in conjunction with a memory system controller 115 or may perform one or more functions ascribed herein to the memory system controller 115. For example, as illustrated in FIG. 1, a memory device 130-a may include a local controller 135-a and a memory device 130-b may include a local controller 135-b.

In some cases, a memory device 130 may be or include a NAND device (e.g., NAND flash device). A memory device 130 may be or include a memory die 160. For example, in some cases, a memory device 130 may be a package that includes one or more dies 160. A die 160 may, in some examples, be a piece of electronics-grade semiconductor cut from a wafer (e.g., a silicon die cut from a silicon wafer). Each die 160 may include one or more planes 165, and each plane 165 may include a respective set of blocks 170, where each block 170 may include a respective set of pages 175, and each page 175 may include a set of memory cells.

In some cases, a NAND memory device 130 may include memory cells configured to each store one bit of information, which may be referred to as SLCs. Additionally or alternatively, a NAND memory device 130 may include memory cells configured to each store multiple bits of information, which may be referred to as MLCs if configured to each store two bits of information, as TLCs if configured to each store three bits of information, as QLCs if configured to each store four bits of information, or more generically as multiple-level memory cells. Multiple-level memory cells may provide greater density of storage relative to SLC memory cells but may, in some cases, involve narrower read or write margins or greater complexities for supporting circuitry. For example, such narrow read or write margins may be relatively susceptible to temperature fluctuations. That is, the cross temperature behavior for multiple-level memory cells, in some cases, may be relatively poor as compared to SLC memory cells.

In some cases, planes 165 may refer to groups of blocks 170, and in some cases, concurrent operations may take place within different planes 165. For example, concurrent operations may be performed on memory cells within different blocks 170 so long as the different blocks 170 are in different planes 165. In some cases, an individual block 170 may be referred to as a physical block, and a virtual block 180 may refer to a group of blocks 170 within which concurrent operations may occur. For example, concurrent operations may be performed on blocks 170-a, 170-b, 170-c, and 170-d that are within planes 165-a, 165-b, 165-c, and 165-d, respectively, and blocks 170-a, 170-b, 170-c, and 170-d may be collectively referred to as a virtual block 180. In some cases, a virtual block may include blocks 170 from different memory devices 130 (e.g., including blocks in one or more planes of memory device 130-*a* and memory device 130-*b*). In some cases, the blocks 170 within a virtual block may have the same block address within their respective planes 165 (e.g., block 170-*a* may be "block 0" of plane 165-*a*, block 170-*b* may be "block 0" of plane 165-*b*, and so on). In some cases, performing concurrent operations in different planes 165 may be subject to one or more restrictions, such as concurrent operations being performed on memory cells within different pages 175 that have the same page address within their respective planes 165 (e.g., related to command decoding, page address decoding circuitry, or other circuitry being shared across planes 165).

In some cases, a block 170 may include memory cells organized into rows (pages 175) and columns (e.g., strings, not shown). For example, memory cells in a same page 175 may share (e.g., be coupled with) a common word line, and memory cells in a same string may share (e.g., be coupled with) a common digit line (which may alternatively be referred to as a bit line).

For some NAND architectures, memory cells may be read and programmed (e.g., written) at a first level of granularity (e.g., at the page level of granularity) but may be erased at a second level of granularity (e.g., at the block level of granularity). That is, a page 175 may be the smallest unit of memory (e.g., set of memory cells) that may be independently programmed or read (e.g., programmed or read concurrently as part of a single program or read operation), and a block 170 may be the smallest unit of memory (e.g., set of memory cells) that may be independently erased (e.g., erased concurrently as part of a single erase operation). Further, in some cases, NAND memory cells may be erased before they can be re-written with new data. Thus, for example, a used page 175 may in some cases not be updated until the entire block 170 that includes the page 175 has been erased.

In some cases, to update some data within a block 170 while retaining other data within the block 170, the memory device 130 may copy the data to be retained to a new block 170 and write the updated data to one or more remaining pages of the new block 170. The memory device 130 (e.g., the local controller 135) or the memory system controller 115 may mark or otherwise designate the data that remains in the old block 170 as invalid or obsolete and may update a logical-to-physical (L2P) mapping table to associate the logical address (e.g., LBA) for the data with the new, valid block 170 rather than the old, invalid block 170. In some cases, such copying and remapping may be performed instead of erasing and rewriting the entire old block 170 due to latency or wearout considerations, for example. In some cases, one or more copies of an L2P mapping table may be stored within the memory cells of the memory device 130 (e.g., within one or more blocks 170 or planes 165) for use (e.g., reference and updating) by the local controller 135 or memory system controller 115.

In some cases, a memory system controller 115 or a local controller 135 may perform operations (e.g., as part of one or more media management algorithms) for a memory device 130, such as wear leveling, background refresh, garbage collection, scrub, block scans, health monitoring, or others, or any combination thereof. For example, within a memory device 130, a block 170 may have some pages 175 containing valid data and some pages 175 containing invalid data. To avoid waiting for all of the pages 175 in the block 170 to have invalid data in order to erase and reuse the block 170, an algorithm referred to as "garbage collection" may be invoked to allow the block 170 to be erased and released as a free block for subsequent write operations. Garbage collection may refer to a set of media management operations that include, for example, selecting a block 170 that contains valid and invalid data, selecting pages 175 in the block that contain valid data, copying the valid data from the selected pages 175 to new locations (e.g., free pages 175 in another block 170), marking the data in the previously selected pages 175 as invalid, and erasing the selected block 170. As a result, the quantity of blocks 170 that have been erased may be increased such that more blocks 170 are available to store subsequent data (e.g., data subsequently received from the host system 105).

The system 100 may include any quantity of non-transitory computer readable media that support triggering a refresh for non-volatile memory. For example, the host system 105, the memory system controller 115, or a memory device 130 may include or otherwise may access one or more non-transitory computer readable media storing instructions (e.g., firmware) for performing the functions ascribed herein to the host system 105, the memory system controller 115, or the memory device 130. For example, such instructions, if executed by the host system 105 (e.g., by the host system controller 106), by the memory system controller 115, or by a memory device 130 (e.g., by a local controller 135), may cause the host system 105, the memory system controller 115, or the memory device 130 to perform one or more associated functions as described herein.

In some cases, a memory system 110 may utilize a memory system controller 115 to provide a managed memory system that may include, for example, one or more memory array's and related circuitry combined with a local (e.g., on-die or in-package) controller (e.g., local controller 135). An example of a managed memory system is an MNAND system.

In some examples, the memory system 110 may include a memory device 130 designed or configured to operate in a range of ambient temperatures. In some cases, operating the memory device 130 at various temperatures may result in varying operating characteristics of the memory device 130. In some cases, one or more blocks 170 of the memory device 130 may be programmed at extreme temperatures (e.g., temperatures above or below a threshold range of temperatures, such as a nominal temperature range), for example, while an automotive system is powered on. However, the memory system 110 may fail to read the blocks 170 due to a difference in operating characteristics at a programming temperature and a read temperature. For example, the memory system 110 may fail to read data if the memory system 110 programmed the data to a block 170 at a first temperature above a threshold temperature but reads the data at a second temperature below the threshold temperature. Additionally or alternatively, the memory system 110 may fail to retain data programmed at extreme temperatures for relatively long periods of time (e.g., greater than a threshold duration).

In some cases, memory devices 130 including memory cells configured to store more than one bit per memory cell (e.g., MLC devices, TLC devices, QLC devices, or any other memory devices 130 or portions of memory devices 130 capable of storing more than one bit per memory cell) may be relatively more affected by extreme temperatures than SLC devices, for example, due to smaller differences in voltage thresholds bounding the different states of the memory cells.

In some examples, the host system 105 and the memory system 110 may support triggering a refresh for non-volatile memory in a memory device 130 after an automotive system powers down. For example, the host system 105 may receive an indication that the automotive system (e.g., a vehicle) is powering down, where the host system 105 and the memory system 110 may enter power off states in response to the indication. The host system 105 may detect a trigger to switch back to a power on state while the automotive system is powered down, the trigger associated with performing a refresh operation at the memory system 110. For example, the trigger may be associated with a threshold temperature at which to perform a refresh operation, a threshold time after which to perform a refresh operation, or both. The host system 105 may enter the power on state and transmit a power on command to the memory system 110. The memory system 110 may perform one or more refresh operations on one or more memory cells while powered on in response to the command and while the vehicle remains in a powered down state. Configuring a host system 105 and a memory system 110 to trigger refreshing non-volatile memory during a vehicle off state may result in higher data retention at the memory system 110 and improved reliability associated with access operations, among other enhancements to cross temperature behavior of the host system 105, the memory system 110, or both.

FIG. 2 illustrates an example of a system 200 that supports triggering a refresh for non-volatile memory in accordance with examples as disclosed herein. The system 200 may be an example of a system 100 as described with reference to FIG. 1 or aspects thereof. The system 200 may include a memory system 210 configured to store data received from the host system 205 and to send data to the host system 205, if requested by the host system 205 using access commands (e.g., read commands or write commands). The system 200 may implement aspects of the system 100 as described with reference to FIG. 1. For example, the memory system 210 and the host system 205 may be examples of the memory system 110 and the host system 105, respectively.

The memory system 210 may include memory devices 240 to store data transferred between the memory system 210 and the host system 205, e.g., in response to receiving access commands from the host system 205, as described herein. The memory devices 240 may include one or more memory devices as described with reference to FIG. 1. For example, the memory devices 240 may include NAND memory, MNAND memory, PCM, self-selecting memory, 3D cross point, other chalcogenide-based memories, FERAM, MRAM, NOR (e.g., NOR flash) memory, STT-MRAM, CBRAM, RRAM, or OxRAM.

The memory system 210 may include a storage controller 230 for controlling the passing of data directly to and from the memory devices 240, e.g., for storing data, retrieving data, and determining memory locations in which to store data and from which to retrieve data. The storage controller 230 may communicate with memory devices 240 directly or via a bus (not shown) using a protocol specific to each type of memory device 240. In some cases, a single storage controller 230 may be used to control multiple memory devices 240 of the same or different types. In some cases, the memory system 210 may include multiple storage controllers 230, e.g., a different storage controller 230 for each type of memory device 240. In some cases, a storage controller 230 may implement aspects of a local controller 135 as described with reference to FIG. 1.

The memory system 210 may additionally include an interface 220 for communication with the host system 205 and a buffer 225 for temporary storage of data being transferred between the host system 205 and the memory devices 240. The interface 220, buffer 225, and storage controller 230 may be for translating data between the host system 205 and the memory devices 240, e.g., as shown by a data path 250, and may be collectively referred to as data path components.

Using the buffer 225 to temporarily store data during transfers may allow data to be buffered as commands are being processed, thereby reducing latency between commands and allowing arbitrary data sizes associated with commands. This may also allow bursts of commands to be handled, and the buffered data may be stored or transmitted (or both) once a burst has stopped. The buffer 225 may include relatively fast memory (e.g., some types of volatile memory, such as SRAM or DRAM) or hardware accelerators or both to allow fast storage and retrieval of data to and from the buffer 225. The buffer 225 may include data path switching components for bi-directional data transfer between the buffer 225 and other components.

The temporary storage of data within a buffer 225 may refer to the storage of data in the buffer 225 during the execution of access commands. That is, upon completion of an access command, the associated data may no longer be maintained in the buffer 225 (e.g., may be overwritten with data for additional access commands). In addition, the buffer 225 may be a non-cache buffer. That is, data may not be read directly from the buffer 225 by the host system 205. For example, read commands may be added to a queue without an operation to match the address to addresses already in the buffer 225 (e.g., without a cache address match or lookup operation).

The memory system 210 may additionally include a memory system controller 215 for executing the commands received from the host system 205 and controlling the data path components in the moving of the data. The memory system controller 215 may be an example of the memory system controller 115 as described with reference to FIG. 1. A bus 235 may be used to communicate between the system components.

In some cases, one or more queues (e.g., a command queue 260, a buffer queue 265, and a storage queue 270) may be used to control the processing of the access commands and the movement of the corresponding data. This may be beneficial, e.g., if more than one access command from the host system 205 is processed concurrently by the memory system 210. The command queue 260, buffer queue 265, and storage queue 270 are depicted at the interface 220, memory system controller 215, and storage controller 230, respectively, as examples of a possible implementation. However, queues, if used, may be positioned anywhere within the memory system 210.

Data transferred between the host system 205 and the memory devices 240 may take a different path in the memory system 210 than non-data information (e.g., commands, status information). For example, the system components in the memory system 210 may communicate with each other using a bus 235, while the data may use the data path 250 through the data path components instead of the bus 235. The memory system controller 215 may control how and if data is transferred between the host system 205 and the memory devices 240 by communicating with the data path components over the bus 235 (e.g., using a protocol specific to the memory system 210).

If a host system 205 transmits access commands to the memory system 210, the commands may be received by the interface 220, e.g., according to a protocol (e.g., a UFS protocol or an eMMC protocol). Thus, the interface 220 may be considered a front end of the memory system 210. Upon receipt of each access command, the interface 220 may communicate the command to the memory system controller 215, e.g., via the bus 235. In some cases, each command may be added to a command queue 260 by the interface 220 to communicate the command to the memory system controller 215.

The memory system controller 215 may determine that an access command has been received from the interface 220. In some cases, the memory system controller 215 may determine the access command has been received by retrieving the command from the command queue 260. The command may be removed from the command queue 260 after it has been retrieved therefrom, e.g., by the memory system controller 215. In some cases, the memory system controller 215 may cause the interface 220, e.g., via the bus 235, to remove the command from the command queue 260.

Upon the determination that an access command has been received, the memory system controller 215 may execute the access command. For a read command, this may mean obtaining data from the memory devices 240 and transmitting the data to the host system 205. For a write command, this may mean receiving data from the host system 205 and moving the data to the memory devices 240.

In either case, the memory system controller 215 may use the buffer 225 for, among other things, temporary storage of the data being received from or sent to the host system 205. The buffer 225 may be considered a middle end of the memory system 210. In some cases, buffer address management (e.g., pointers to address locations in the buffer 225) may be performed by hardware (e.g., dedicated circuits) in the interface 220, buffer 225, or storage controller 230.

To process a write command received from the host system 205, the memory system controller 215 may first determine if the buffer 225 has sufficient available space to store the data associated with the command. For example, the memory system controller 215 may determine, e.g., via firmware (e.g., controller firmware), an amount of space within the buffer 225 that may be available to store data associated with the write command.

In some cases, a buffer queue 265 may be used to control a flow of commands associated with data stored in the buffer 225, including write commands. The buffer queue 265 may include the access commands associated with data currently stored in the buffer 225. In some cases, the commands in the command queue 260 may be moved to the buffer queue 265 by the memory system controller 215 and may remain in the buffer queue 265 while the associated data is stored in the buffer 225. In some cases, each command in the buffer queue 265 may be associated with an address at the buffer 225. That is, pointers may be maintained that indicate where in the buffer 225 the data associated with each command is stored. Using the buffer queue 265, multiple access commands may be received sequentially from the host system 205 and at least portions of the access commands may be processed concurrently.

If the buffer 225 has sufficient space to store the write data, the memory system controller 215 may cause the interface 220 to transmit an indication of availability to the host system 205 (e.g., a "ready to transfer" indication), e.g., according to a protocol (e.g., a UFS protocol or an eMMC protocol). As the interface 220 subsequently receives from the host system 205 the data associated with the write command, the interface 220 may transfer the data to the buffer 225 for temporary storage using the data path 250). In some cases, the interface 220 may obtain from the buffer 225 or buffer queue 265 the location within the buffer 225 to store the data. The interface 220 may indicate to the memory system controller 215, e.g., via the bus 235, if the data transfer to the buffer 225 has been completed.

Once the write data has been stored in the buffer 225 by the interface 220, the data may be transferred out of the buffer 225 and stored in a memory device 240. This may be done using the storage controller 230. For example, the memory system controller 215 may cause the storage controller 230 to retrieve the data out of the buffer 225 using the data path 250) and transfer the data to a memory device 240. The storage controller 230 may be considered a back end of the memory system 210. The storage controller 230 may indicate to the memory system controller 215, e.g., via the bus 235, that the data transfer to a memory device of the memory devices 240 has been completed.

In some cases, a storage queue 270) may be used to aid with the transfer of write data. For example, the memory system controller 215 may push (e.g., via the bus 235) write commands from the buffer queue 265 to the storage queue 270 for processing. The storage queue 270 may include entries for each access command. In some examples, the storage queue 270 may additionally include a buffer pointer (e.g., an address) that may indicate where in the buffer 225 the data associated with the command is stored and a storage pointer (e.g., an address) that may indicate the location in the memory devices 240 associated with the data. In some cases, the storage controller 230 may obtain from the buffer 225, buffer queue 265, or storage queue 270 the location within the buffer 225 from which to obtain the data. The storage controller 230 may manage the locations within the memory devices 240 to store the data (e.g., performing wear-leveling, garbage collection, and the like). The entries may be added to the storage queue 270, e.g., by the memory system controller 215. The entries may be removed from the storage queue 270, e.g., by the storage controller 230 or memory system controller 215 upon completion of the transfer of the data.

To process a read command received from the host system 205, the memory system controller 215 may again first determine if the buffer 225 has sufficient available space to store the data associated with the command. For example, the memory system controller 215 may determine, e.g., via firmware (e.g., controller firmware), an amount of space within the buffer 225 that may be available to store data associated with the read command.

In some cases, the buffer queue 265 may be used to aid with buffer storage of data associated with read commands in a similar manner as discussed above with respect to write commands. For example, if the buffer 225 has sufficient space to store the read data, the memory system controller 215 may cause the storage controller 230 to retrieve the data associated with the read command from a memory device 240 and store the data in the buffer 225 for temporary storage using the data path 250. The storage controller 230 may indicate to the memory system controller 215, e.g., via the bus 235, upon complete data transfer to the buffer 225.

In some cases, the storage queue 270 may be used to aid with the transfer of read data. For example, the memory system controller 215 may push the read command to the storage queue 270 for processing. In some cases, the storage controller 230 may obtain from the buffer 225 or storage queue 270 the location within the memory devices 240 from which to retrieve the data. In some cases, the storage controller 230 may obtain from the buffer queue 265 the location within the buffer 225 to store the data. In some cases, the storage controller 230 may obtain from the storage queue 270 the location within the buffer 225 to store the data. In some cases, the memory system controller 215 may move the command processed by the storage queue 270 back to the command queue 260.

Once the data has been stored in the buffer 225 by the storage controller 230, the data may be transferred out of the buffer 225 and sent to the host system 205. For example, the memory system controller 215 may cause the interface 220 to retrieve the data out of the buffer 225 using the data path 250 and transmit the data to the host system 205, e.g., according to a protocol (e.g., a UFS protocol or an eMMC protocol). For example, the interface 220 may process the command from the command queue 260 and may indicate to the memory system controller 215, e.g., via the bus 235, that the data transmission to the host system 205 has been completed.

The memory system controller 215 may execute received commands according to an order (e.g., a first-in, first-out order, according to the order of the command queue 260). For each command, the memory system controller 215 may cause data corresponding to the command to be moved into and out of the buffer 225, as discussed above. As the data is moved into and stored within the buffer 225, the command may remain in the buffer queue 265. A command may be removed from the buffer queue 265, e.g., by the memory system controller 215, if the processing of the command has been completed (e.g., if data corresponding to the access command has been transferred out of the buffer 225). If a command is removed from the buffer queue 265, the address previously storing the data associated with that command may be available to store data associated with a new command.

The memory system controller 215 may additionally be configured for operations associated with the memory devices 240. For example, the memory system controller 215 may execute or manage operations such as wear-leveling operations, garbage collection operations, error control operations such as error-detecting operations or error-correcting operations, encryption operations, caching operations, media management operations, background refresh, health monitoring, and address translations between logical addresses (e.g., LBAs) associated with commands from the host system 205 and physical addresses (e.g., physical block addresses) associated with memory cells within the memory devices 240. That is, the host system 205 may issue commands indicating one or more LBAs and the memory system controller 215 may identify one or more physical block addresses indicated by the LBAs. In some cases, one or more contiguous LBAs may correspond to noncontiguous physical block addresses. In some cases, the storage controller 230 may be configured to perform one or more of the above operations in conjunction with or instead of the memory system controller 215. In some cases, the memory system controller 215 may perform the functions of the storage controller 230 and the storage controller 230 may be omitted.

In some examples, the memory system 210 may be additionally configured to support triggering a refresh for non-volatile memory at a memory device 240, for example, providing additional functionality for an automotive system (e.g., a vehicle including the host system 205 and the memory system 210) in a power down state. For example, if the automotive system is in a power down state, the memory system 210 may receive a power on command from the host system 205 and, in some cases, a refresh command, such that the memory system 210 may perform one or more refresh operations on the memory cells of a memory device 240. In some cases, the memory system 210 may transmit an indication of a refresh capability of the memory system 210 to the host system 205. The refresh capability may include one or more parameters that may be used by the host system 205 to determine whether to initiate a refresh operation for the memory system 210 (e.g., the refresh capability may determine one or more trigger conditions for refreshing non-volatile memory). For example, the refresh capability may include a duration for performing a refresh operation at the memory system 210, a threshold temperature for programming data to the memory system 210, a target temperature range for programming data to the memory system 210, a data retention capability of the memory system 210, cross-temperature handling information for the memory system 210, a quantity of memory cell levels for the memory system 210, or a combination thereof. In some examples, the refresh operations associated with the refresh command may be directed towards (or may otherwise correspond to) memory cells of the memory device 240 that were programmed at extreme temperatures (e.g., temperatures above a threshold temperature or temperatures below a threshold temperature), as compared to a nominal temperature range of the memory device 240. For example, if the automotive system is in a power on state, the memory system 210 may program one or more memory cells of the memory device 240 while subject to relatively high temperatures (e.g., due to ambient heat from an engine of the automotive system, or due to any other heat source causing extreme temperatures at the memory device 240) as compared to a configured temperature range (e.g., nominal temperature range) of the memory device 240.

To support such refresh operations, the memory system 210 may be configured to track memory cells that were programmed at extreme temperatures (e.g., above a threshold temperature, or otherwise outside a threshold temperature range). As such, the memory system 210 may store a list of blocks 275 which the memory system 210 may use to record which blocks (e.g., non-volatile blocks) of the memory device 240 include memory cells programmed at extreme temperatures. By way of example, the memory system 210 may identify one or more blocks of the memory device 240 that satisfy one or more threshold criteria. In some cases, the memory system 210 may add a block identifier for each block (e.g., QLC blocks or other blocks) satisfying the threshold criteria to the list of blocks 275 stored in memory. In some cases, the threshold criteria may include a temperature threshold, such that if a block of the memory device 240 has been programmed at a temperature that satisfies the temperature threshold, the memory system 210 may add a block identifier associated with the block to the list of blocks 275. Additionally or alternatively, the threshold criteria may include a quantity of errors associated with a block satisfying a threshold quantity of errors. In some cases, the memory system 210) may store the list of blocks 275 in volatile memory of the memory system 210, for example, at local memory of the memory system controller 215 (e.g., in SRAM).

In some examples, a refresh operation at the memory system 210 may be associated with moving data from a first physical address to a second physical address (e.g., a different physical address or reprogrammed to the same physical address at a different temperature). For example, upon receiving the refresh command, the memory system 210 may read data from one or more memory cells of the memory device 240, such as the data associated with block identifiers in the list of blocks 275, and the memory system 210 may write the data back to a different portion (e.g., a different non-volatile memory resource) or the same portion of the memory device 240. In some examples, the memory system 210 may reprogram such data from a first portion to a second portion of the memory device 240 while a temperature of the memory system 210, the memory device 240, or both satisfies a target temperature range. For example, in response to the automotive system entering a power off mode, the ambient temperature of the memory system 210) may gradually lower (e.g., due to an engine being off, decreased use of a battery, or any other reason for reducing heat from the environment of the memory system 210). As such, the memory system 210 may perform the refresh operation, in response to the refresh command, such that the memory system 210 may reprogram data previously programmed at an extreme ambient temperature (e.g., above a threshold temperature) at a lower ambient temperature (e.g., a temperature within a nominal temperature range of the memory system 210).

In some cases, the memory system 210 may be configured to perform a clean shut down, where the memory system 210 may commit data from volatile memory to non-volatile memory, for example, at the memory device 240. The clean shut down may allow the memory system 210 to persist data initially stored in volatile memory once the memory system 210 loses power by moving the data to non-volatile memory (e.g., which may maintain a programmed state without a power input).

The memory system 210 may perform the clean shut down before performing the refresh operation. For example, the memory system 210 may receive, from the host system 205, a power off command. In response to receiving the power off command, the memory system 210 may identify data stored in volatile memory of the memory system 210 and program the data to non-volatile memory (e.g., within a memory device 240). The memory system 210 may enter an off state subsequent to (or otherwise in response to) programming the data to the non-volatile memory. In some examples, the memory system 210 may store an indication of the list of blocks 275 to refresh in non-volatile memory during the clean shut down. If a refresh operation is triggered while the vehicle is powered down, the memory system 210 may use the list of blocks 275 persisted in non-volatile memory to determine which blocks to refresh. Alternatively, if the memory system 210 does not persist the list of blocks 275 in non-volatile memory, the memory system 210 may redetermine the list of blocks 275 to refresh in response to powering back up, in response to receiving a refresh command, or both. Accordingly, the memory system 210 may support refreshing one or more non-volatile memory blocks while a vehicle including the memory system 210 remains in a powered down state (e.g., the vehicle remains parked).

FIG. 3 illustrates an example of a system 300 that supports triggering a refresh for non-volatile memory in accordance with examples as disclosed herein. The system 300 may be an example of a system 100, a system 200, or a combination thereof, as described with reference to FIGS. 1 and 2. The system 300 may include a host system 305 configured to trigger refresh operations at a memory system 310 in response to an automotive system (e.g., a vehicle including the system 300) entering a power down mode.

In some examples, the host system 305 may include a host system controller 315 such as host system controller 106 as described with reference to FIG. 1, an interface 320 for communications with the memory system 310, and a power control 325 coupling components within the host system 305 to a power source 330. The power source 330 may be an example of (or may make use of) a battery within the system 300 or the automotive system. For example, the power source 330 may be a component of the host system 305 or may be external to the host system 305. The interface 320 may communicate commands, data, or both between the host system 305 and the memory system 310. The memory system 310 may program data to one or more memory devices 350 or read data from one or more memory devices 350 in response to access commands received from the host system 305. The host system 305 may include a bus 335 with which the components within the host system 305 may communicate. Additionally or alternatively, the power source 330 may provide power to one or more other components according to commands or instructions from the power control 325. For example, the power source 330 may provide power to the host system controller 315, the interface 320, the memory system 310, or any combination thereof (e.g., using connections 340).

The host system 305 may receive an indication that the automotive system is powering down (e.g., turning an engine off, switching a battery from a high power state to a low power state, or any other means of powering down a vehicle). In some examples, in response to receiving the indication that the automotive system is powering down, the host system 305 may initiate a clean shut down of the memory system 310 as described with reference to FIG. 2. Additionally, the host system 305 may be configured to enter a power off state in response to receiving the indication that the automotive system is powering down, for example, to conserve power in the system 300. While in the power off state, the host system 305 may support refresh operations at the memory system 310, for example, to alleviate memory cell damage caused by programming or reading memory cells at extreme temperatures. For example, while in the power off state, the host system 305 may operate using a relatively small amount of power (e.g., as compared to a power on state) to support monitoring for one or more triggers to initiate the refresh operations at the memory system 310.

As described herein, operating the automotive system in a power on state may cause relatively high ambient operating temperatures (or may otherwise be associated with a relatively wide range of ambient operating temperatures, including relatively high ambient operating temperatures above a threshold temperature). For example, prior to receiving the indication that the automotive system is powering down, the temperature of the environment proximal to the system 300 may be relatively high due to running an engine of the vehicle relatively near the system 300. In such an example, the system 300 may program one or more memory cells of the memory device 350 at relatively high temperatures (e.g., as compared to a nominal programming temperature or nominal temperature range). In some cases, programming such memory cells at extreme temperatures may result in relatively unreliable data storage. For example, the memory system 310 may not be able to accurately read the memory cells due to a difference in operating characteristics between a programming temperature and a read temperature. Additionally or alternatively, due to such read failures, the memory device 350 may fail to retain data programmed at extreme temperatures for relatively long periods of time. If data refreshes are not performed while the automotive system is powered down, the automotive system may turn on after a relatively long period of time and the memory system 310 may fail to refresh non-volatile blocks of the memory device, in some cases, resulting in a loss of data.

In some examples, the ambient temperature proximal to the system 300 may decrease in response to the vehicle powering down (e.g., powering down a heat source such as an engine, a battery, or any other heat source). As such, to improve data retention, the host system 305 and the memory system 310 may support performing refresh operations while the vehicle is powered down and while the system 300 may operate at a nominal temperature (e.g., a temperature within a nominal temperature range, a temperature below a temperature threshold).

To support performing refresh operations while operating in the power off state, the host system 305 may be configured to receive or determine one or more inputs-such as a time input 355, a temperature input 360, or both—to monitor for one or more triggering conditions of a refresh operation. The trigger conditions may be associated with the ambient temperature decreasing. For example, the host system 205 may use the inputs to determine whether the system 300 is operating according to operating conditions that support reliable data programming (e.g., a nominal temperature at which data may be programmed with relatively high reliability). In some examples, the trigger conditions may include (or may otherwise be determined using) refresh capabilities at the memory system 310, such as the refresh capabilities as described with reference to FIG. 2.

In a first example, the host system controller 315 may receive a time input 355 (e.g., from a device or component external to the host system 305), and the host system controller 315 may use the time input 355 to determine whether a threshold time has passed after receiving the indication that the vehicle is powering down. For example, a component maintaining a timing mechanism (e.g., a real-time clock (RTC) or another mechanism) while the vehicle is powered down may determine an amount of time that has elapsed since the vehicle powered down. In such an example, the threshold time may be associated with a time duration corresponding to an ambient temperature cool down (e.g., a time duration from vehicle power down associated with the ambient temperature being predicted to drop to a nominal temperature within a nominal temperature range, below a temperature threshold, or both). In some cases, the time input 355 may be an absolute time value, and the host system 305 may store an absolute time value at which the vehicle powered down for comparison to the time input 355. In some other cases, the time input 355 may be a relative time value (e.g., a time that has passed since the vehicle powered down). In some examples, the time-based trigger condition may be associated with a time since the vehicle powered down, a time since the host system 305 powered down, a time since the memory system 310 powered down, or any combination thereof. The host system controller 315 may receive the time input 355 according to a periodicity or in response to a trigger (e.g., an external component may send the time input 355 to the host system controller 315 if the time input 355 satisfies a trigger condition for triggering a refresh operation at the memory system 310).

Additionally or alternatively, the host system controller 315 may receive a temperature input 360 (e.g., from a device or component external to the host system 305), and the host system controller 315 may use the temperature input 360 to determine whether a threshold temperature has been satisfied (e.g., after receiving the indication that the vehicle is powering down). For example, a component maintaining a temperature sensing mechanism while the vehicle is powered down may determine a temperature value associated with the system 300. The temperature value may be a temperature sensed at the host system 305, at the memory system 310, at a memory device 350, or at any other component proximal to the system 300 such that the temperature value is similar (e.g., within a threshold difference) to an operating temperature for a memory device 350 to program data to one or more non-volatile memory blocks. The host system controller 315 may receive the temperature input 360 according to a periodicity or in response to a trigger (e.g., an external component may send the temperature input 360 to the host system controller 315 if the temperature input 360 satisfies a trigger condition for triggering a refresh operation at the memory system 310).

Additionally or alternatively, the host system 305 may include, or may otherwise be configured with, a clock 365, a temperature sensor 370), or the like to monitor for such trigger conditions. For example, additional or alternative to receiving a time input 355, a temperature input 360, or both, the host system 305 may monitor for a time input (e.g., using a clock 365), a temperature input (e.g., using a temperature sensor 370)), or both. In some examples, while operating in a powered down state, the host system controller 315 may receive an amount of power from a power source 330 satisfying a threshold for supporting monitoring a time, a temperature, or both using a clock 365, a temperature sensor 370, or both. The clock 365 may be an example of or include an RTC, or the clock 365 may track relative times between operations performed by the host system controller 315. The temperature sensor 370 may be any type of temperature sensing mechanism, such as a thermal sensor, a temperature sensing circuit, a digital temperature sensor, or any other component capable of determining a current temperature value. The host system controller 315 may use a time input 355, a temperature input 360, a clock 365, a temperature sensor 370, or any combination thereof to determine whether a refresh operation is triggered for the memory system 310. In some cases, the host system 305 may trigger a refresh operation if a threshold time has passed, if a current temperature measurement satisfies a threshold temperature (e.g., is below a threshold temperature, is within a nominal temperature range), or both, where the host system 305 may monitor for the trigger in a powered down state and may detect the trigger using the time input 355, the temperature input 360, the clock 365, the temperature sensor 370, or any combination thereof.

In some examples, if the host system 305 detects a trigger (e.g., associated with performing a refresh operation at the memory system 310), the host system 305 may switch to a power on state while the vehicle is still powered down in response to determining that one or more trigger conditions are satisfied. For example, the host system 305 may determine that the threshold time has passed, a threshold temperature has been satisfied, or both. As such, the host system 305 may enter a power on state in response to detecting the trigger (e.g., satisfaction of at least one trigger condition) and may transmit a command to power on the memory system 310. In other words, the host system 305 may transmit the command to power on the memory system 310 in accordance with detecting the trigger associated with performing the refresh operation at the memory system 310.

In some examples, the host system 305 may determine whether the host system 305 is triggered to power on due to the vehicle powering up or due to a trigger for a refresh operation being satisfied (e.g., while the vehicle remains powered down). In some cases, the host system 305, the memory system 310, or both may power on to a relatively low power mode as compared to a full power mode if powering on due to a trigger for a refresh operation being satisfied. For example, if the host system 305 and the memory system 310 are powering on to perform a refresh operation, the power source 330 may provide a relatively lower power to the host system 305, the memory system 310, or both than is provided during normal operations (e.g., if the vehicle is running). The relatively lower power may support at least performing the refresh operation at the memory system 310. In some cases, the host system controller 315 may use a trigger event signal (e.g., from the power control 325) to determine whether the host system 305 is being powered on while the vehicle is parked. In some cases, the host system 305 may refrain from performing a boot process and may instead trigger issuing a refresh command to the memory system 310 in response to the trigger event signal. In some other cases, the host system 305 may perform a boot process and respond to the trigger event signal (e.g., issue a refresh command) upon completion of the boot process. The host system 305, the memory system 310, or both may determine which refresh operations to perform according to the time input 355, the temperature input 360, the clock 365, the temperature sensor 370, or any combination thereof.

In some cases, the host system 305 may allow the memory system 310 to determine whether to refresh memory cells at the memory system 310, for example, based on (e.g., in response to) the memory system 310 determining that a threshold idle time has been satisfied (e.g., as part of a boot up procedure or otherwise). For example, the memory system 310 may enter a power on state in response to the power on command from the host system 305. After a threshold idle time of being powered on, the memory system 310 may determine to perform a refresh operation (e.g., in accordance with one or more refresh criteria or parameters at the memory system 310). That is, the memory system 310 may internally trigger a refresh operation after being idle for a threshold time duration. In some other cases, the host system 305 may transmit a refresh command to the memory system 310, for example, in response to determining the satisfaction of the one or more trigger conditions (e.g., detecting the trigger associated with performing the refresh command at the memory system 310). The host system 305 may send the refresh command to the memory system 310 (e.g., using the interface 320), and the memory system 310 may perform a refresh operation in response to the refresh command.

In some examples, the host system 305 may transmit a command to power off the memory system 310 at a threshold time after transmitting the command to power on the memory system 310. The threshold time may correspond to an idle time for triggering the refresh operation at the memory system 310, a duration for performing the refresh operation at the memory system 310, or both. For example, the host system 305 may transmit the command to power off the memory system 310 after a threshold time period within which the memory system 310 may refresh one or more memory cells, such as the memory cells within a list of blocks as described with reference to FIG. 2.

By supporting refresh triggering as described herein, the host system 305 may support performing a refresh operation at a memory system 310 during a time period in which the vehicle including the host system 305 and the memory system 310 is powered off. Accordingly, if the vehicle is parked for a long duration (e.g., greater than a threshold time at which memory cells of the memory system 310 may potentially fail to retain their state), the host system 305 may continue to manage the memory system 310 during the duration and refresh data (e.g., one time, periodically, or aperiodically) to support data retention at the memory devices 350 of the memory system 310.

Figure 4:
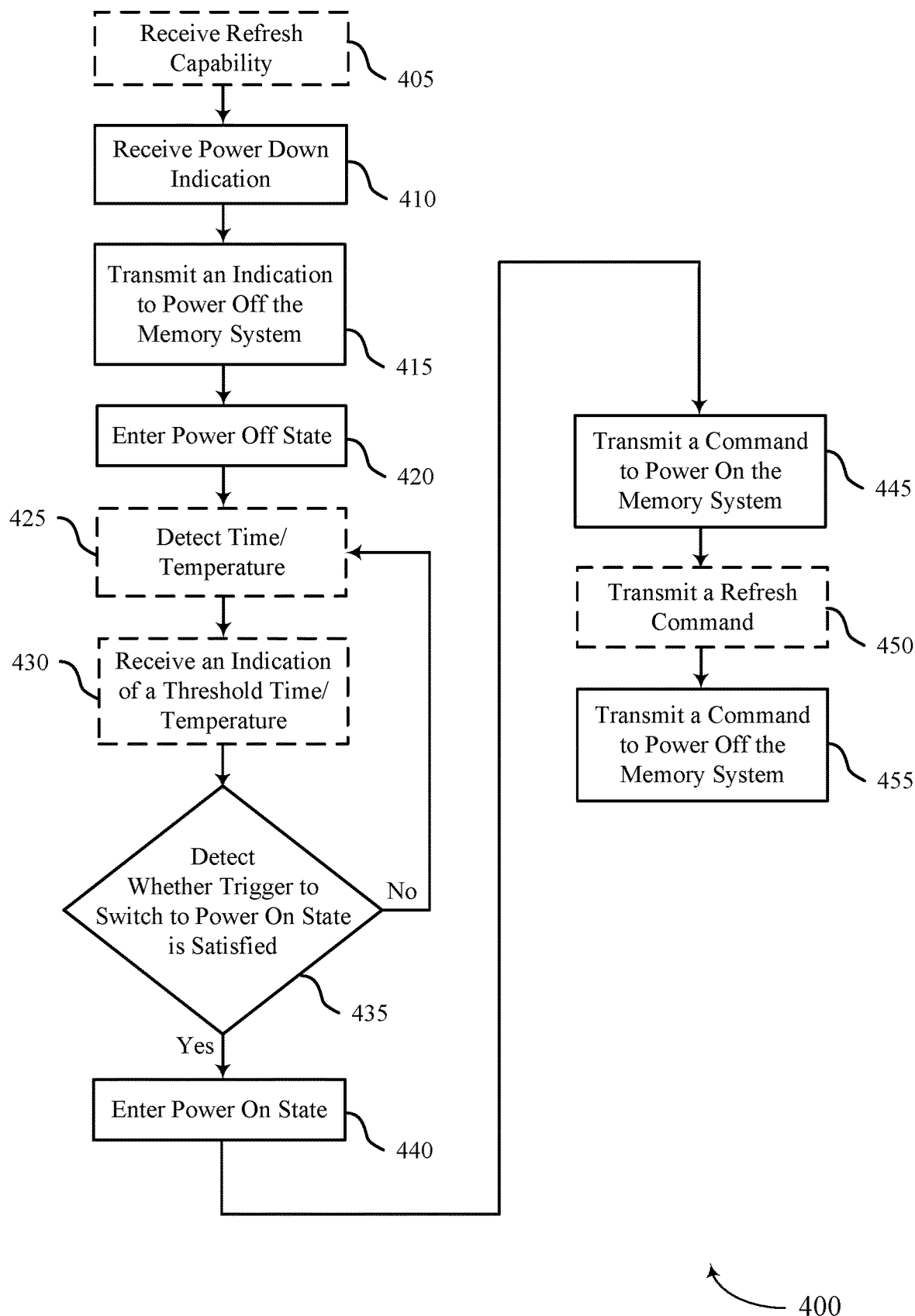
FIG. 4 illustrates an example of a process flow that supports triggering a refresh for non-volatile memory in accordance with examples as disclosed herein.

FIG. 4 illustrates an example of a process flow 400 that supports triggering a refresh for non-volatile memory in accordance with examples as disclosed herein. The operations of the process flow 400 may be implemented by a host system, a memory system, an automotive system, or components thereof as described herein. For example, the operations of the process flow 400 may be performed by a system as described with reference to FIGS. 1 through 3. A host system may initiate a refresh operation at a memory system in response to a trigger while an automotive system is powered down, such that one or more cells programmed at extreme temperatures may be reprogrammed at relatively lower temperatures (e.g., as compared to such extreme temperatures). Alternative examples of the following may be implemented, where some steps are performed in a different order or not at all. Additionally, some steps may include additional features not mentioned below.

Aspects of the process flow 400 may be implemented by a controller, among other components (e.g., a host system controller, a memory system controller such as an MNAND die of a memory device). Additionally or alternatively, aspects of the process flow 400 may be implemented as instructions stored in memory (e.g., firmware stored in a memory coupled with the memory device). For example, the instructions, if executed by a controller (e.g., a host system controller), may cause the controller to perform the operations of the process flow 400.

At 405, a refresh capability may be received. For example, a memory system may transmit, to a host system, an indication of a refresh capability of the memory system. The host system and the memory system may be associated with a vehicle (e.g., a vehicle system including the host system and the memory system). In some examples, the memory system may send the indication of the refresh capability as part of a boot procedure. In some cases, a trigger (e.g., satisfaction of a trigger condition as described with reference to FIG. 3) may be associated with the refresh capability. The refresh capability may be an example of one or more of the refresh capabilities as described with reference to FIG. 2.

At 410, a power down indication may be received. For example, the host system may receive an indication that the vehicle (e.g., the automotive system including the host system and the memory system) is powering down.

At 415, an indication to power off may be transmitted. For example, the host system may transmit a command to power off the memory system based on (e.g., in response to) receiving the indication that the vehicle is powering down at 410. The memory system may perform a clean shut down process in response to the power off command.

At 420, a power off state may be entered. For example, the host system may enter a power off state based on (e.g., in response to receiving) the indication that the vehicle is powering down at 410.

In some examples, at 425, a time, temperature, or both may be detected. For example, the host system may be equipped with a temperature sensor that may detect a current temperature associated with the host system, the memory system, or both. Additionally or alternatively, the host system may be configured to maintain an RTC, and the host system may determine an amount of time that has passed after receiving the indication that the vehicle is powering down using the RTC. In some examples, at 430, an indication of a threshold time, a threshold temperature, or the like may be received. For example, the host system may receive an indication that a threshold time has passed after the vehicle powered down, that a temperature satisfies a temperature threshold, or both (e.g., from an external component as described with reference to FIG. 3).

At 435, it is determined whether a trigger to switch to a power on state is detected. For example, a system (e.g., including the vehicle system, the host system, the memory system, or any combination thereof) may detect a trigger to switch the host system to a power on state while the vehicle is powered down. The trigger may be associated with performing a refresh operation at the memory system. In some examples, the host system may receive an indication that a threshold time has passed, that a temperature satisfies a temperature threshold, or both, where the trigger is detected in response to receiving the indication. In some examples, the host system may determine whether a threshold temperature, a threshold time, or the like has been satisfied. For example, the host system may determine whether the threshold time has passed after receiving the indication at 410 using a time detected at 425 or an indication received at 430, may determine whether the threshold temperature has been satisfied using a temperature detected at 425 or an indication received at 430, or a combination thereof. If the host system determines that the threshold time, the threshold temperature, or both have not been satisfied, the host system may continue monitoring for a trigger, for example, by detecting a time, a temperature, or both at 425, receiving one or more additional indications at 430, or both.

In some cases, the host system may use machine learning techniques, heuristics, or other techniques to determine one or more refresh criteria for the memory system using inputs such as environmental factors, temperature transitions, temperature thresholds, RTC inputs, event logs, an operational lifetime, driver usage historical data, or any combination thereof. The host system may use such techniques to determine one or more trigger conditions for triggering a refresh operation. Triggering a refresh operation may additionally involve triggering a switch to a power on state for the host system, the memory system, or both, such that the memory system may receive an amount of power sufficient to perform the triggered refresh operation.

If a trigger to switch to a power on state is detected, at 440, a power on state may be entered. For example, an event may trigger a power on operation at the host system while the vehicle system is parked. The vehicle system may provide power to the host system and the memory system in response to detecting the trigger at 435. The host system may enter a power on state using the provided power.

At 445, a command to power on the memory system may be transmitted. For example, the host system may transmit a command to power on the memory system based on (e.g., in response to) detecting the trigger at 435 and in accordance with the host system operating in the power on state. To support powering on the memory system, the host system may be configured to control a voltage applied to the memory system, for example, using a power controller, a power supply, or the like as described with reference to FIG. 3. In some cases, providing power to the memory system may be supported by the system providing power to the host system and the command to power on the memory system.

In some examples, at 450, a refresh command may be transmitted. For example, the host system may issue a refresh command to the memory system in response to detecting the trigger at 435. Alternatively, the host system may allow the memory system to autonomously determine to refresh the memory cells of the memory system, for example, if an idle time of the memory system satisfies a threshold idle time after providing the power to the memory system. The memory system may perform the refresh operation in response to the refresh command or in response to determining that the idle time of the memory system satisfies the threshold idle time. In some examples, the system may perform a refresh operation for one or more non-volatile first blocks of the memory system while the vehicle is powered down and while providing power to the host system and the memory system. In such examples, the refresh operation may include reprogramming data from the one or more non-volatile first blocks to one or more non-volatile second blocks of the memory system (e.g., the same blocks or different blocks).

At 455, a command to power off the memory system may be transmitted. For example, the host system may transmit a command to power off the memory system after the memory system performs the refresh operation. In some examples, the host system may transmit the command to power off the memory system a threshold time after transmitting the refresh command, after a threshold time associated with the memory system refreshing memory cells, or in response to any other trigger to power off the memory system. In some other examples, the memory system may send an indication that a refresh operation is complete to the host system, and the host system may transmit the command to power off the memory system in response to the indication that the refresh operation is complete. The memory system may reenter a power off state in response to the command. Additionally, the host system may reenter a power off state after transmitting the command.

If the vehicle reenters an on state, the host system may receive an indication that the vehicle is powering up. The temperature difference between the vehicle turning off and the vehicle turning on may be significant (e.g., greater than a threshold difference). However, due to performing the refresh operation while the vehicle is in the off state, the memory system may mitigate the negative effects of cross-temperature access operations for such temperature differences due to reprogramming data at one or more temperatures closer to the temperature at vehicle turn on time. That is, the host system may use environmental inputs to trigger refresh events for a memory system while a vehicle (e.g., a vehicle system including the host system and the memory system) is parked.

Figure 5:
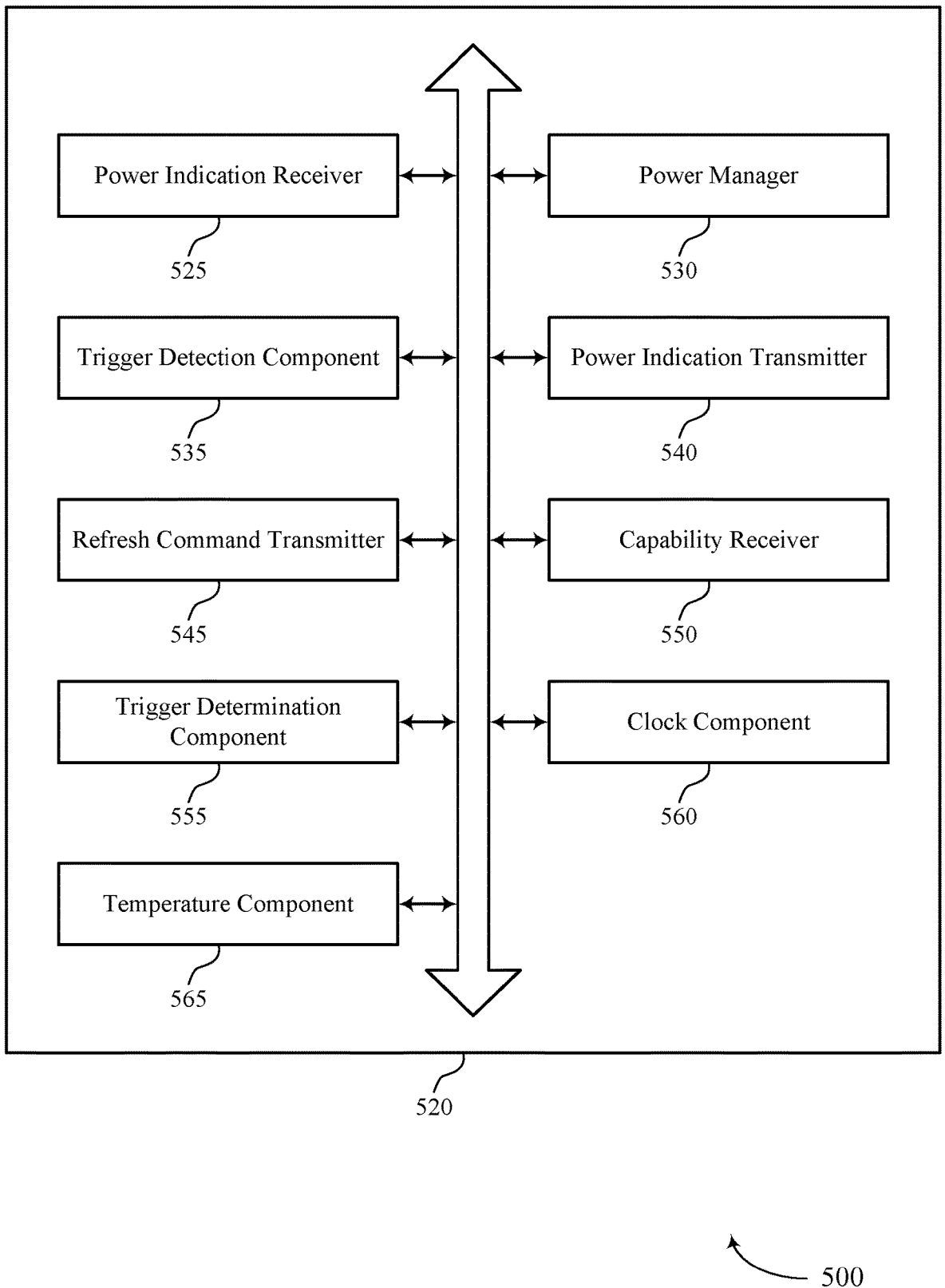
FIG. 5 shows a block diagram of a host system that supports triggering a refresh for non-volatile memory in accordance with examples as disclosed herein.

FIG. 5 shows a block diagram 500 of a host system 520 that supports triggering a refresh for non-volatile memory in accordance with examples as disclosed herein. The host system 520 may be an example of aspects of a host system as described with reference to FIGS. 1 through 4. The host system 520, or various components thereof, may be an example of means for performing various aspects of triggering a refresh for non-volatile memory as described herein. For example, the host system 520 may include a power indication receiver 525, a power manager 530, a trigger detection component 535, a power indication transmitter 540, a refresh command transmitter 545, a capability receiver 550, a trigger determination component 555, a clock component 560, a temperature component 565, or any combination thereof. Each of these components may communicate, directly or indirectly, with one another (e.g., via one or more buses). The host system 520 may include a controller configured to couple with a memory system associated with a vehicle, where the controller may be configured to cause the host system 520 to perform one or more operations as described herein. The vehicle may include the host system 520 and the memory system.

The power indication receiver 525 may be configured as or otherwise support a means for receiving an indication that the vehicle is powering down. The power manager 530 may be configured as or otherwise support a means for entering a power off state based at least in part on (e.g., in response to) the indication that the vehicle is powering down. The trigger detection component 535 may be configured as or otherwise support a means for detecting a trigger to switch to a power on state while the vehicle is powered down and while in the power off state, the trigger associated with performing a refresh operation at the memory system associated with the vehicle. In some examples, the power manager 530 may be configured as or otherwise support a means for entering the power on state based on (e.g., in response to) detecting the trigger. The power indication transmitter 540 may be configured as or otherwise support a means for transmitting, to the memory system, while the vehicle is powered down and while in the power on state, a command to power on the memory system based on (e.g., in response to) the trigger associated with performing the refresh operation at the memory system.

In some examples, the power indication transmitter 540 may be configured as or otherwise support a means for transmitting, to the memory system, a command to power off the memory system based on (e.g., in response to) a threshold time passing after transmitting the command to power on the memory system, the threshold time corresponding to an idle time for triggering the refresh operation at the memory system, a duration for performing the refresh operation at the memory system, or both.

In some examples, the refresh command transmitter 545 may be configured as or otherwise support a means for transmitting, to the memory system and after transmitting the command to power on the memory system, a refresh command based on (e.g., in response to) detecting the trigger associated with performing the refresh operation at the memory system.

In some examples, the trigger determination component 555 may be configured as or otherwise support a means for determining whether the trigger is based on (e.g., in response to) the vehicle powering up or is associated with performing the refresh operation at the memory system, where transmitting the refresh command is based on (e.g., in response to) determining that the trigger is associated with performing the refresh operation at the memory system.

In some examples, the power indication transmitter 540 may be configured as or otherwise support a means for transmitting, to the memory system and after transmitting the refresh command, a command to power off the memory system based on (e.g., in response to) a threshold time passing after transmitting the refresh command, the threshold time corresponding to a duration for performing the refresh operation at the memory system.

In some examples, to support detecting the trigger, the trigger detection component 535 may be configured as or otherwise support a means for determining whether a threshold time has passed after receiving the indication that the vehicle is powering down, where the trigger is detected based on (e.g., in response to) determining that the threshold time has passed after receiving the indication that the vehicle is powering down.

In some examples, the clock component 560 may be configured as or otherwise support a means for maintaining an RTC, where determining whether the threshold time has passed after receiving the indication that the vehicle is powering down is based on (e.g., referencing or otherwise using) the RTC.

In some examples, the trigger detection component 535 may be configured as or otherwise support a means for determining whether a temperature satisfies a threshold temperature, where the trigger is detected based on (e.g., in response to) determining that the temperature satisfies the threshold temperature. In some examples, the temperature component 565 may be configured as or otherwise support a means for detecting the temperature using a temperature sensor.

In some examples, the trigger detection component 535 may be configured as or otherwise support a means for receiving an indication that a threshold time has passed after the vehicle powered down, that a temperature satisfies a temperature threshold, or both, where the trigger is detected based on (e.g., in response to) receiving the indication that the threshold time has passed, that the temperature satisfies the temperature threshold, or both.

In some examples, the power indication transmitter 540 may be configured as or otherwise support a means for transmitting, to the memory system, a command to power off the memory system based on (e.g., in response to) the indication that the vehicle is powering down, where the command to power on the memory system is transmitted based on (e.g., in response to) the memory system being powered off.

In some examples, the capability receiver 550 may be configured as or otherwise support a means for receiving, from the memory system, a refresh capability of the memory system before entering the power off state. In some examples, the trigger may be further associated with the refresh capability. In some examples, the refresh capability may include a threshold duration between refresh operations for the memory system, a duration for performing the refresh operation at the memory system, a threshold temperature for programming data to the memory system, a target temperature range for programming the data to the memory system, a data retention capability of the memory system, cross-temperature handling information for the memory system, a type of memory cells included in the memory system, or any combination thereof.

In some examples, the power manager 530 may be configured as or otherwise support a means for controlling a voltage applied to the memory system based on (e.g., in response to) detecting the trigger associated with performing the refresh operation at the memory system.

In some examples, the refresh operation corresponds to one or more quad-level memory cells (e.g., QLCs) of the memory system. In some examples, transmitting the command to power on the memory system based on (e.g., in response to detecting) the trigger associated with performing the refresh operation at the memory system configures the memory system to reprogram data from one or more first blocks corresponding to the one or more quad-level memory cells to one or more second blocks corresponding to the one or more quad-level memory cells while a temperature associated with the memory system satisfies a target temperature range.

Figure 6:
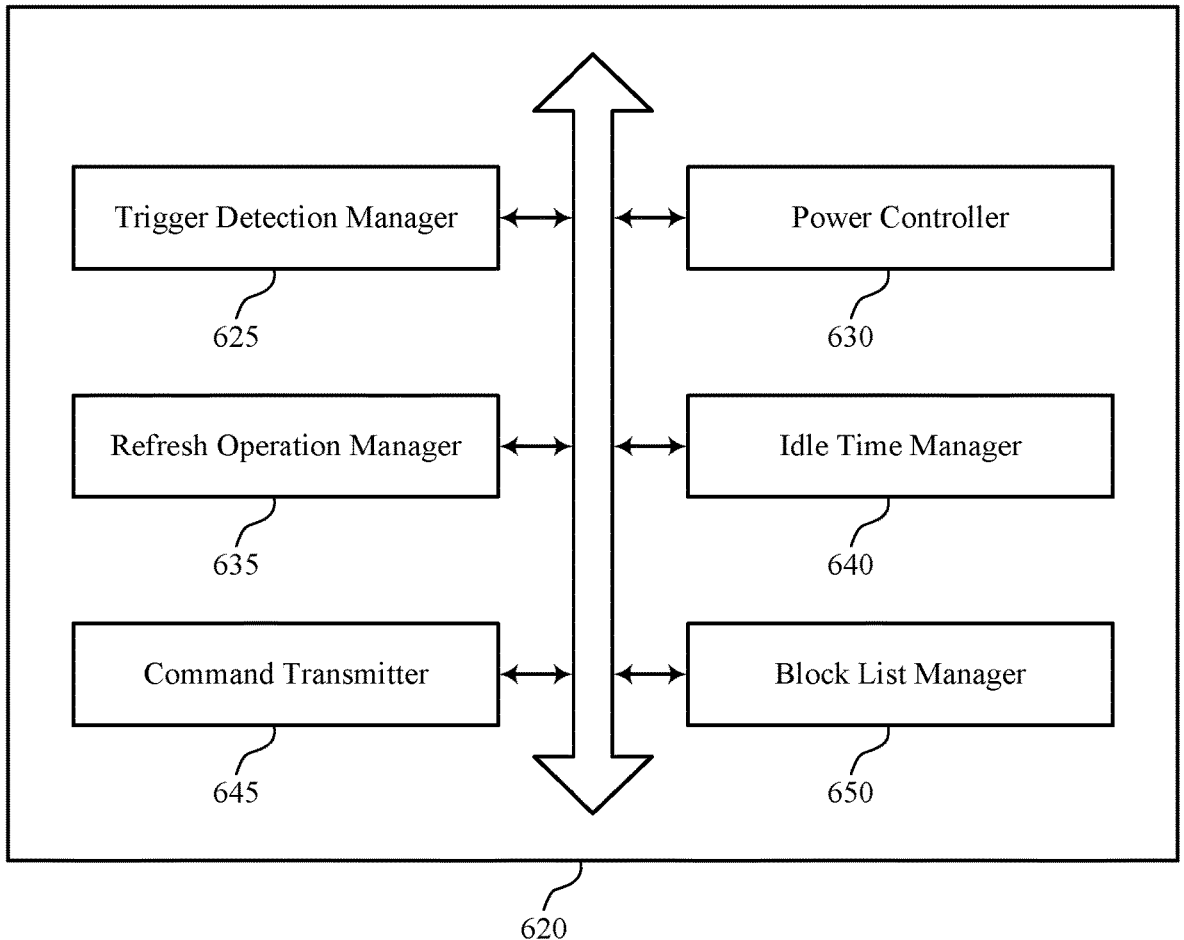
FIG. 6 shows a block diagram of a vehicle system that supports triggering a refresh for non-volatile memory in accordance with examples as disclosed herein.

FIG. 6 shows a block diagram 600 of a vehicle system 620 that supports triggering a refresh for non-volatile memory in accordance with examples as disclosed herein. The vehicle system 620 may be an example of aspects of a vehicle, vehicle system, or automotive system as described with reference to FIGS. 1 through 4. The vehicle system 620, or various components thereof, may be an example of means for performing various aspects of triggering a refresh for non-volatile memory as described herein. For example, the vehicle system 620 may include a trigger detection manager 625, a power controller 630, a refresh operation manager 635, an idle time manager 640, a command transmitter 645, a block list manager 650, or any combination thereof. Each of these components may communicate, directly or indirectly, with one another (e.g., via one or more buses). The vehicle system may include a host system configured to couple with a memory system associated with a vehicle (e.g., the vehicle system). The vehicle system may further include a controller associated with the host system and the memory system, where the controller may be configured to cause the vehicle system to perform one or more operations as described herein.

The trigger detection manager 625 may be configured as or otherwise support a means for detecting a trigger to switch the host system for the memory system to a power on state while the vehicle is powered down, the trigger associated with performing a refresh operation at the memory system. The power controller 630 may be configured as or otherwise support a means for providing power to the host system and the memory system based on (e.g., in response to) detecting the trigger. The refresh operation manager 635 may be configured as or otherwise support a means for performing a refresh operation for one or more non-volatile first blocks of the memory system while the vehicle is powered down and based on (e.g., in response to) providing power to the host system and the memory system, the refresh operation including reprogramming data from the one or more non-volatile first blocks of the memory system to one or more non-volatile second blocks of the memory system.

In some examples, the idle time manager 640 may be configured as or otherwise support a means for determining whether an idle time of the memory system satisfies a threshold idle time after providing the power to the memory system, where performing the refresh operation is based on (e.g., in response to) determining that the idle time of the memory system satisfies the threshold idle time.

In some examples, the command transmitter 645 may be configured as or otherwise support a means for issuing, from the host system to the memory system, a refresh command based on (e.g., in response to) detecting the trigger associated with performing the refresh operation at the memory system, where performing the refresh operation is based on (e.g., in response to) the refresh command.

In some examples, the block list manager 650 may be configured as or otherwise support a means for storing a list of non-volatile memory blocks at the memory system, where the list of non-volatile memory blocks indicates the one or more non-volatile first blocks of the memory system to refresh during the refresh operation.

In some examples, the block list manager 650 may be configured as or otherwise support a means for adding a block identifier to the list of non-volatile memory blocks based on (e.g., in accordance with) a non-volatile memory block corresponding to the block identifier being programmed at a temperature satisfying a threshold temperature, detecting a quantity of errors satisfying a threshold quantity of errors for the non-volatile memory block corresponding to the block identifier, or both.

In some examples, the trigger detection manager 625 may be configured as or otherwise support a means for determining whether a threshold time has passed after receiving an indication that the vehicle is powering down, whether a temperature satisfies a temperature threshold, or both, where the trigger is detected based on (e.g., in response to) determining that the threshold time has passed after receiving the indication that the vehicle is powering down, that the temperature satisfies the temperature threshold, or both.

In some examples, the trigger detection manager 625 may be configured as or otherwise support a means for receiving an indication that a threshold time has passed after the vehicle powered down, that a temperature satisfies a temperature threshold, or both, where the trigger is detected based on (e.g., in response to) receiving the indication.

In some examples, the command transmitter 645 may be configured as or otherwise support a means for issuing, from the host system to the memory system, a command to power on the memory system, where providing power to the memory system is based on (e.g., in response to) providing power to the host system and the command to power on the memory system.

Figure 7:
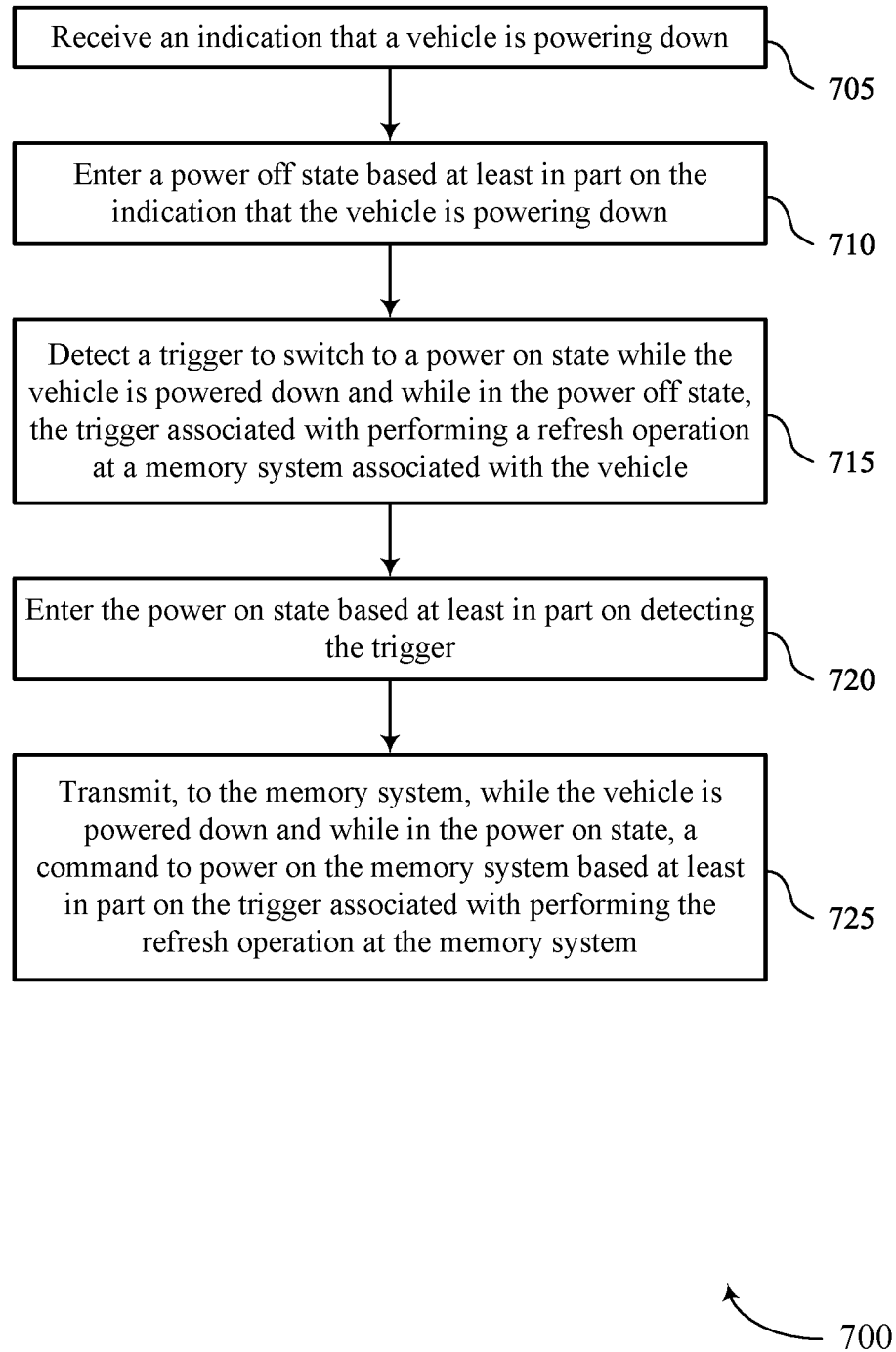
FIGS. 7 and 8 show flowcharts illustrating a method or methods that support triggering a refresh for non-volatile memory in accordance with examples as disclosed herein.

FIG. 7 shows a flowchart illustrating a method 700 that supports triggering a refresh for non-volatile memory in accordance with examples as disclosed herein. The operations of method 700 may be implemented by a host system or its components as described herein. For example, the operations of method 700 may be performed by a host system as described with reference to FIGS. 1 through 5. In some examples, a host system may execute a set of instructions to control the functional elements of the device to perform the described functions. Additionally or alternatively, the host system may perform aspects of the described functions using special-purpose hardware.

At 705, the method may include receiving an indication that a vehicle is powering down. The operations of 705 may be performed in accordance with examples as disclosed herein. In some examples, aspects of the operations of 705 may be performed by a power indication receiver 525 as described with reference to FIG. 5.

At 710, the method may include entering a power off state based on (e.g., in response to) the indication that the vehicle is powering down. The operations of 710 may be performed in accordance with examples as disclosed herein. In some examples, aspects of the operations of 710 may be performed by a power manager 530 as described with reference to FIG. 5.

At 715, the method may include detecting a trigger to switch to a power on state while the vehicle is powered down and while in the power off state, the trigger associated with performing a refresh operation at a memory system associated with the vehicle. The operations of 715 may be performed in accordance with examples as disclosed herein. In some examples, aspects of the operations of 715 may be performed by a trigger detection component 535 as described with reference to FIG. 5.

At 720, the method may include entering the power on state based on (e.g., in response to) detecting the trigger. The operations of 720 may be performed in accordance with examples as disclosed herein. In some examples, aspects of the operations of 720 may be performed by a power manager 530 as described with reference to FIG. 5.

At 725, the method may include transmitting, to the memory system, while the vehicle is powered down and while in the power on state, a command to power on the memory system based on (e.g., in response to detecting) the trigger associated with performing the refresh operation at the memory system. The operations of 725 may be performed in accordance with examples as disclosed herein. In some examples, aspects of the operations of 725 may be performed by a power indication transmitter 540 as described with reference to FIG. 5.

In some examples, an apparatus as described herein may perform a method or methods, such as the method 700. The apparatus may include, features, circuitry, logic, means, or instructions (e.g., a non-transitory computer-readable medium storing instructions executable by a processor) for receiving an indication that the vehicle is powering down, entering a power off state based on (e.g., in response to) the indication that the vehicle is powering down, detecting a trigger to switch to a power on state while the vehicle is powered down and while in the power off state, the trigger associated with performing a refresh operation at a memory system associated with the vehicle, entering the power on state based on (e.g., in response to) detecting the trigger, and transmitting, to the memory system, while the vehicle is powered down and while in the power on state, a command to power on the memory system based on (e.g., in response to detecting) the trigger associated with performing the refresh operation at the memory system.

Some examples of the method 700 and the apparatus described herein may further include operations, features, circuitry, logic, means, or instructions for transmitting, to the memory system, a command to power off the memory system based on (e.g., in response to) a threshold time passing after transmitting the command to power on the memory system, the threshold time corresponding to an idle time for triggering the refresh operation at the memory system, a duration for performing the refresh operation at the memory system, or both.

Some examples of the method 700 and the apparatus described herein may further include operations, features, circuitry, logic, means, or instructions for transmitting, to the memory system and after transmitting the command to power on the memory system, a refresh command based on (e.g., in response to) detecting the trigger associated with performing the refresh operation at the memory system.

Some examples of the method 700 and the apparatus described herein may further include operations, features, circuitry, logic, means, or instructions for determining whether the trigger may be based on (e.g., in response to) the vehicle powering up or may be associated with performing the refresh operation at the memory system, where transmitting the refresh command may be based on (e.g., in response to) determining that the trigger is associated with performing the refresh operation at the memory system.

Some examples of the method 700 and the apparatus described herein may further include operations, features, circuitry, logic, means, or instructions for transmitting, to the memory system and after transmitting the refresh command, a command to power off the memory system based on (e.g., in response to) a threshold time passing after transmitting the refresh command, the threshold time corresponding to a duration for performing the refresh operation at the memory system.

In some examples of the method 700 and the apparatus described herein, operations, features, circuitry, logic, means, or instructions for detecting the trigger may include operations, features, circuitry, logic, means, or instructions for determining whether a threshold time has passed after receiving the indication that the vehicle is powering down, where the trigger may be detected based on (e.g., in response to) determining that the threshold time has passed after receiving the indication that the vehicle is powering down.

Some examples of the method 700 and the apparatus described herein may further include operations, features, circuitry, logic, means, or instructions for maintaining an RTC, where determining whether the threshold time has passed after receiving the indication that the vehicle is powering down may be based on (e.g., referencing) the RTC.

Some examples of the method 700 and the apparatus described herein may further include operations, features, circuitry, logic, means, or instructions for determining whether a temperature satisfies a threshold temperature, where the trigger may be detected based on (e.g., in response to) determining that the temperature satisfies the threshold temperature.

Some examples of the method 700 and the apparatus described herein may further include operations, features, circuitry, logic, means, or instructions for detecting the temperature using a temperature sensor.

Some examples of the method 700 and the apparatus described herein may further include operations, features, circuitry, logic, means, or instructions for receiving an indication that a threshold time has passed after the vehicle powered down, that a temperature satisfies a temperature threshold, or both, where the trigger may be detected based on (e.g., in response to) receiving the indication that the threshold time has passed, that the temperature satisfies the temperature threshold, or both.

Some examples of the method 700 and the apparatus described herein may further include operations, features, circuitry, logic, means, or instructions for transmitting, to the memory system, a command to power off the memory system based on (e.g., in response to) the indication that the vehicle is powering down, where the command to power on the memory system may be transmitted based on (e.g., in response to) the memory system being powered off.

Some examples of the method 700 and the apparatus described herein may further include operations, features, circuitry, logic, means, or instructions for receiving, from the memory system, a refresh capability of the memory system before entering the power off state, where the trigger may be further associated with the refresh capability, and the refresh capability includes a threshold duration between refresh operations for the memory system, a duration for performing the refresh operation at the memory system, a threshold temperature for programming data to the memory system, a target temperature range for programming the data to the memory system, a data retention capability of the memory system, cross-temperature handling information for the memory system, a type of memory cells included in the memory system, or any combination thereof.

Some examples of the method 700 and the apparatus described herein may further include operations, features, circuitry, logic, means, or instructions for controlling a voltage applied to the memory system based on (e.g., in response to) detecting the trigger associated with performing the refresh operation at the memory system.

In some examples of the method 700 and the apparatus described herein, the refresh operation corresponds to one or more quad-level memory cells of the memory system and transmitting the command to power on the memory system based on (e.g., in response to detecting) the trigger associated with performing the refresh operation at the memory system configures the memory system to reprogram data from one or more first blocks corresponding to the one or more quad-level memory cells to one or more second blocks corresponding to the one or more quad-level memory cells while a temperature associated with the memory system satisfies a target temperature range.

Figure 8:
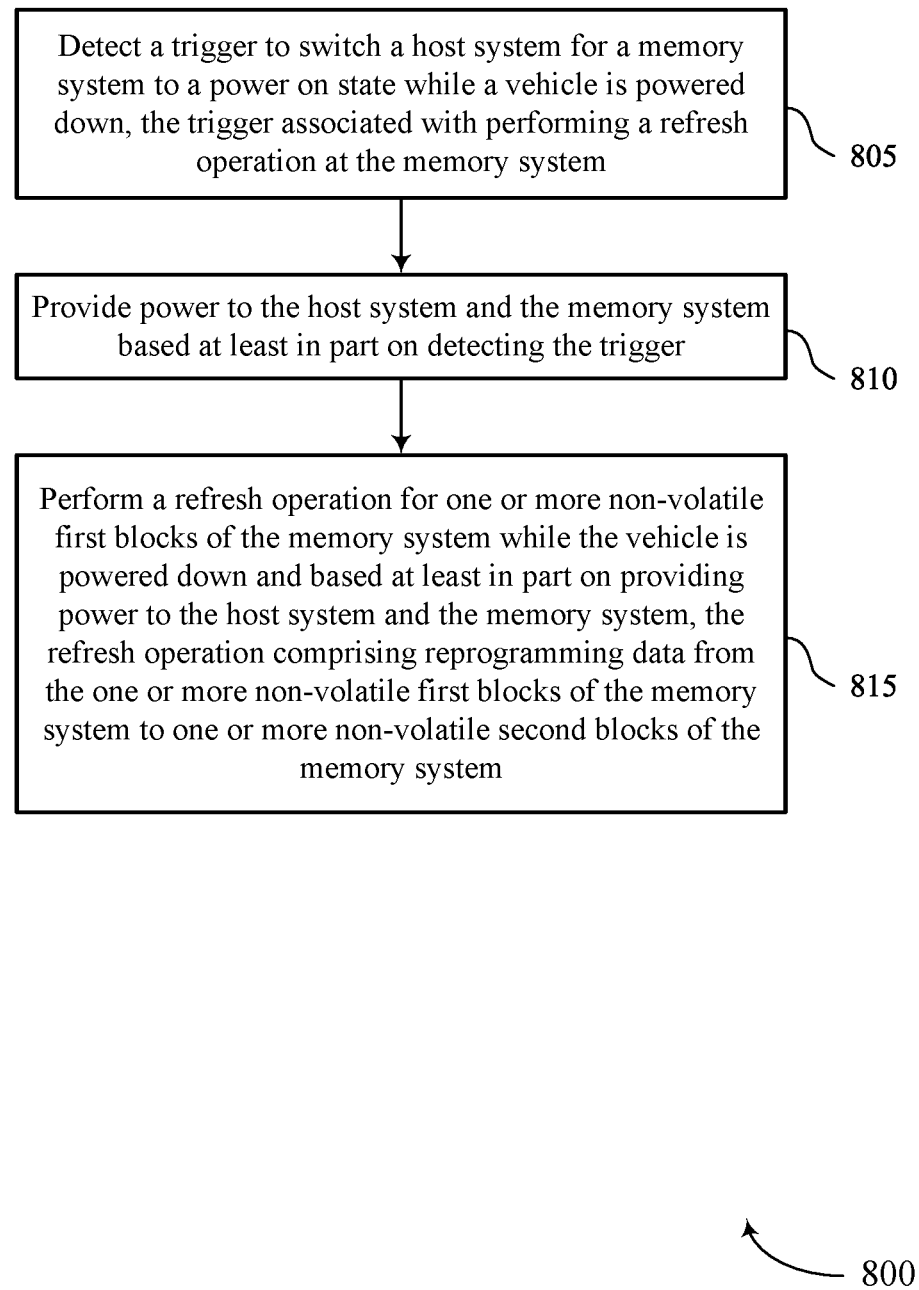

FIG. 8 shows a flowchart illustrating a method 800 that supports triggering a refresh for non-volatile memory in accordance with examples as disclosed herein. The operations of method 800 may be implemented by a vehicle system or its components as described herein. For example, the operations of method 800 may be performed by a vehicle system as described with reference to FIGS. 1 through 4 and 6. In some examples, a vehicle system may execute a set of instructions to control the functional elements of the device to perform the described functions. Additionally or alternatively, the vehicle system may perform aspects of the described functions using special-purpose hardware.

At 805, the method may include detecting a trigger to switch a host system for a memory system to a power on state while a vehicle is powered down, the trigger associated with performing a refresh operation at the memory system. The operations of 805 may be performed in accordance with examples as disclosed herein. In some examples, aspects of the operations of 805 may be performed by a trigger detection manager 625 as described with reference to FIG. 6.

At 810, the method may include providing power to the host system and the memory system based on (e.g., in response to) detecting the trigger. The operations of 810 may be performed in accordance with examples as disclosed herein. In some examples, aspects of the operations of 810 may be performed by a power controller 630 as described with reference to FIG. 6.

At 815, the method may include performing a refresh operation for one or more non-volatile first blocks of the memory system while the vehicle is powered down and based on (e.g., in response to) providing power to the host system and the memory system, the refresh operation including reprogramming data from the one or more non-volatile first blocks of the memory system to one or more non-volatile second blocks of the memory system. The operations of 815 may be performed in accordance with examples as disclosed herein. In some examples, aspects of the operations of 815 may be performed by a refresh operation manager 635 as described with reference to FIG. 6.

In some examples, an apparatus as described herein may perform a method or methods, such as the method 800. The apparatus may include, features, circuitry, logic, means, or instructions (e.g., a non-transitory computer-readable medium storing instructions executable by a processor) for detecting a trigger to switch a host system for a memory system to a power on state while the vehicle is powered down, the trigger associated with performing a refresh operation at the memory system, providing power to the host system and the memory system based on (e.g., in response to) detecting the trigger, and performing a refresh operation for one or more non-volatile first blocks of the memory system while the vehicle is powered down and based on (e.g., in response to) providing power to the host system and the memory system, the refresh operation including reprogramming data from the one or more non-volatile first blocks of the memory system to one or more non-volatile second blocks of the memory system.

Some examples of the method 800 and the apparatus described herein may further include operations, features, circuitry, logic, means, or instructions for determining whether an idle time of the memory system satisfies a threshold idle time after providing the power to the memory system, where performing the refresh operation may be based on (e.g., in response to) determining that the idle time of the memory system satisfies the threshold idle time.

Some examples of the method 800 and the apparatus described herein may further include operations, features, circuitry, logic, means, or instructions for issuing, from the host system to the memory system, a refresh command based on (e.g., in response to) detecting the trigger associated with performing the refresh operation at the memory system, where performing the refresh operation may be based on (e.g., in response to) the refresh command.

Some examples of the method 800 and the apparatus described herein may further include operations, features, circuitry, logic, means, or instructions for storing a list of non-volatile memory blocks at the memory system, where the list of non-volatile memory blocks indicates the one or more non-volatile first blocks of the memory system to refresh during the refresh operation.

Some examples of the method 800 and the apparatus described herein may further include operations, features, circuitry, logic, means, or instructions for adding a block identifier to the list of non-volatile memory blocks based on (e.g., in accordance with) a non-volatile memory block corresponding to the block identifier being programmed at a temperature satisfying a threshold temperature, detecting a quantity of errors satisfying a threshold quantity of errors for the non-volatile memory block corresponding to the block identifier, or both.

Some examples of the method 800 and the apparatus described herein may further include operations, features, circuitry, logic, means, or instructions for determining whether a threshold time has passed after receiving an indication that the vehicle is powering down, whether a temperature satisfies a temperature threshold, or both, where the trigger may be detected based on (e.g., in response to) determining that the threshold time has passed after receiving the indication that the vehicle is powering down, that the temperature satisfies the temperature threshold, or both.

Some examples of the method 800 and the apparatus described herein may further include operations, features, circuitry, logic, means, or instructions for receiving an indication that a threshold time has passed after the vehicle powered down, that a temperature satisfies a temperature threshold, or both, where the trigger may be detected based on (e.g., in response to) receiving the indication.

Some examples of the method 800 and the apparatus described herein may further include operations, features, circuitry, logic, means, or instructions for issuing, from the host system to the memory system, a command to power on the memory system, where providing power to the memory system may be based on (e.g., in response to) providing power to the host system and the command to power on the memory system.

It should be noted that the methods described above describe possible implementations, and that the operations and the steps may be rearranged or otherwise modified and that other implementations are possible. Further, portions from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal: however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit according to the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to a condition of moving from an open-circuit relationship between components in which signals are not presently capable of being communicated between the components over a conductive path to a closed-circuit relationship between components in which signals are capable of being communicated between components over the conductive path. If a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other if the switch is open. If a controller isolates two components, the controller affects a change that prevents signals from flowing between the components using a conductive path that previously permitted signals to flow.

As used herein, the term "substantially" means that the modified characteristic (e.g., a verb or adjective modified by the term substantially) may not be absolute but may be close enough to achieve the advantages of the characteristic.

The term "in response to" may refer to one condition or action occurring at least partially, if not fully, as a result of a previous condition or action. For example, a first condition or action may be performed and second condition or action may at least partially occur as a result of the previous condition or action occurring (whether directly after or after one or more other intermediate conditions or actions occurring after the first condition or action).

Additionally, the terms "directly in response to" or "in direct response to" may refer to one condition or action occurring as a direct result of a previous condition or action. In some examples, a first condition or action may be performed and second condition or action may occur directly as a result of the previous condition or action occurring independent of whether other conditions or actions occur. In some examples, a first condition or action may be performed and second condition or action may occur directly as a result of the previous condition or action occurring, such that no other intermediate conditions or actions occur between the earlier condition or action and the second condition or action or a limited quantity of one or more intermediate steps or actions occur between the earlier condition or action and the second condition or action. Any condition or action described herein as being performed "based on," "based at least in part on," or "in response to" some other step, action, event, or condition may additionally or alternatively (e.g., in an alternative example) be performed "in direct response to" or "directly in response to" such other condition or action unless otherwise specified.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In some other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as an n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" if a voltage greater than or equal to the transistor's threshold voltage is applied to the transistor gate. The transistor may be "off" or "deactivated" if a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration" and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a hyphen and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over, as one or more instructions or code, a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and components described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C).

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or technologies such as infrared, radio, and microwave, then the coaxial cable, fiber optic cable, twisted pair, DSL, or technologies such as infrared, radio, and microwave are included in the definition of medium. Disk and disc, as used herein, include CD, laser disc, optical disc, digital versatile disc (DVD), floppy disk, and Blu-ray disc, where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. An apparatus, comprising:
   processing circuitry configured to couple with a memory system associated with a vehicle, wherein the processing circuitry is configured to cause the apparatus to:
   receive an indication that the vehicle is powering down;
   enter a power off state based at least in part on the indication that the vehicle is powering down;
   detect a trigger to switch to a power on state while the vehicle is powered down and while in the power off state, the trigger associated with performing a refresh operation at the memory system associated with the vehicle;
   enter the power on state based at least in part on detecting the trigger;
   transmit, to the memory system, while the vehicle is powered down and while in the power on state, a command to power on the memory system based at least in part on the trigger associated with performing the refresh operation at the memory system; and
   transmit, to the memory system, a command to power off the memory system based at least in part on a threshold time passing after transmitting the command to power on the memory system, the threshold time corresponding to an idle time for triggering the refresh operation at the memory system, a duration for performing the refresh operation at the memory system, or both.

2. The apparatus of claim 1, wherein the processing circuitry is further configured to cause the apparatus to:
   transmit, to the memory system and after transmitting the command to power on the memory system, a refresh command based at least in part on detecting the trigger associated with performing the refresh operation at the memory system.

3. The apparatus of claim 2, wherein the processing circuitry is further configured to cause the apparatus to:
   transmit, to the memory system and after transmitting the refresh command, a command to power off the memory system based at least in part on a threshold time passing after transmitting the refresh command, the threshold time corresponding to a duration for performing the refresh operation at the memory system.

4. The apparatus of claim 1, wherein, to detect the trigger, the processing circuitry configured to cause the apparatus to:
   determine whether a threshold time has passed after receiving the indication that the vehicle is powering down, wherein the trigger is detected based at least in part on determining that the threshold time has passed after receiving the indication that the vehicle is powering down.

5. The apparatus of claim 4, wherein the processing circuitry is further configured to cause the apparatus to:
   maintain a real time clock, wherein determining whether the threshold time has passed after receiving the indication that the vehicle is powering down is based at least in part on the real time clock.

6. The apparatus of claim 1, wherein the processing circuitry is further configured to cause the apparatus to:
   determine whether a temperature satisfies a threshold temperature, wherein the trigger is detected based at least in part on determining that the temperature satisfies the threshold temperature.

7. The apparatus of claim 6, wherein the processing circuitry is further configured to cause the apparatus to:
   detect the temperature using a temperature sensor.

8. The apparatus of claim 1, wherein the processing circuitry is further configured to cause the apparatus to:
   receive an indication that a threshold time has passed after the vehicle powered down, that a temperature satisfies a temperature threshold, or both, wherein the trigger is detected based at least in part on receiving the indication that the threshold time has passed, that the temperature satisfies the temperature threshold, or both.

9. The apparatus of claim 1, wherein the processing circuitry is further configured to cause the apparatus to:
transmit, to the memory system, a command to power off the memory system based at least in part on the indication that the vehicle is powering down, wherein the command to power on the memory system is transmitted based at least in part on the memory system being powered off.

10. The apparatus of claim 1, wherein the processing circuitry is further configured to cause the apparatus to:
control a voltage applied to the memory system based at least in part on detecting the trigger associated with performing the refresh operation at the memory system.

11. The apparatus of claim 1, wherein:
the refresh operation corresponds to one or more quad-level memory cells of the memory system; and
transmitting the command to power on the memory system based at least in part on the trigger associated with performing the refresh operation at the memory system configures the memory system to reprogram data from one or more first blocks corresponding to the one or more quad-level memory cells to one or more second blocks corresponding to the one or more quad-level memory cells while a temperature associated with the memory system satisfies a target temperature range.

12. An apparatus, comprising:
processing circuitry configured to couple with a memory system associated with a vehicle, wherein the processing circuitry is configured to cause the apparatus to:
receive an indication that the vehicle is powering down;
enter a power off state based at least in part on the indication that the vehicle is powering down;
detect a trigger to switch to a power on state while the vehicle is powered down and while in the power off state, the trigger associated with performing a refresh operation at the memory system associated with the vehicle;
enter the power on state based at least in part on detecting the trigger;
transmit, to the memory system, while the vehicle is powered down and while in the power on state, a command to power on the memory system based at least in part on the trigger associated with performing the refresh operation at the memory system;
determine whether the trigger is based at least in part on the vehicle powering up or is associated with performing the refresh operation at the memory system; and
transmit, to the memory system and after transmitting the command to power on the memory system, a refresh command based at least in part on detecting the trigger associated with performing the refresh operation at the memory system, wherein transmitting the refresh command is based at least in part on determining that the trigger is associated with performing the refresh operation at the memory system.

13. An apparatus, comprising:
processing circuitry configured to couple with a memory system associated with a vehicle, wherein the processing circuitry is configured to cause the apparatus to:
receive, from the memory system, a refresh capability of the memory system before entering a power off state, wherein the refresh capability comprises a threshold duration between refresh operations for the memory system, a duration for performing a refresh operation at the memory system, a threshold temperature for programming data to the memory system, a target temperature range for programming the data to the memory system, a data retention capability of the memory system, cross-temperature handling information for the memory system, a type of memory cells included in the memory system, or any combination thereof;
receive an indication that the vehicle is powering down;
enter the power off state based at least in part on the indication that the vehicle is powering down;
detect a trigger to switch to a power on state while the vehicle is powered down and while in the power off state, the trigger associated with performing the refresh operation at the memory system associated with the vehicle and the trigger further associated with the refresh capability;
enter the power on state based at least in part on detecting the trigger; and
transmit, to the memory system, while the vehicle is powered down and while in the power on state, a command to power on the memory system based at least in part on the trigger associated with performing the refresh operation at the memory system.

14. A non-transitory computer-readable medium storing code comprising instructions which, when executed by processing circuitry of an electronic device, cause the electronic device to:
receive an indication that a vehicle is powering down;
enter a power off state based at least in part on the indication that the vehicle is powering down;
detect a trigger to switch to a power on state while the vehicle is powered down and while in the power off state, the trigger associated with performing a refresh operation at a memory system associated with the vehicle;
enter the power on state based at least in part on detecting the trigger;
transmit, to the memory system, while the vehicle is powered down and while in the power on state, a command to power on the memory system based at least in part on the trigger associated with performing the refresh operation at the memory system; and
transmit, to the memory system, a command to power off the memory system based at least in part on a threshold time passing after transmitting the command to power on the memory system, the threshold time corresponding to an idle time for triggering the refresh operation at the memory system, a duration for performing the refresh operation at the memory system, or both.

15. The non-transitory computer-readable medium of claim 14, wherein the instructions, when executed by the processing circuitry of the electronic device, further cause the electronic device to:
transmit, to the memory system and after transmitting the command to power on the memory system, a refresh command based at least in part on detecting the trigger associated with performing the refresh operation at the memory system.

* * * * *